United States Patent
Khalilinia

(10) Patent No.: US 11,539,348 B1
(45) Date of Patent: Dec. 27, 2022

(54) OPEN LOOP REACTANCE MATCHING CIRCUITRY

(71) Applicant: Glowolt Inc., San Mateo, CA (US)

(72) Inventor: Hamed Khalilinia, San Mateo, CA (US)

(73) Assignee: Glowolt Inc., San Mateo, CA (US)

( * ) Notice: Subject to any disclaimer, the term of this patent is extended or adjusted under 35 U.S.C. 154(b) by 80 days.

(21) Appl. No.: 16/948,865

(22) Filed: Oct. 2, 2020

Related U.S. Application Data

(60) Provisional application No. 62/909,854, filed on Oct. 3, 2019.

(51) Int. Cl.
  *H03H 11/28* (2006.01)
  *H03F 3/21* (2006.01)

(52) U.S. Cl.
  CPC .............. *H03H 11/28* (2013.01); *H03F 3/21* (2013.01)

(58) Field of Classification Search
  CPC .................................. H03H 11/28; H03F 3/21
  See application file for complete search history.

(56) References Cited

U.S. PATENT DOCUMENTS

| | | | | |
|---|---|---|---|---|
| 5,585,766 A | * | 12/1996 | Shel | H01F 29/146 336/155 |
| 5,936,481 A | * | 8/1999 | Fujii | H03H 7/40 333/32 |
| 7,909,483 B2 | | 3/2011 | Jacobs et al. | H05B 45/00 362/276 |
| 8,970,060 B2 | | 3/2015 | Ichikawa et al. | B60L 53/122 307/10.1 |
| 9,985,442 B2 | | 5/2018 | Von Novak, III et al. | H02J 5/005 |
| 2016/0013667 A1 | | 1/2016 | Hosotani et al. | H02J 50/40 307/104 |
| 2016/0268992 A1 | * | 9/2016 | Salfelner | H01Q 7/00 |

FOREIGN PATENT DOCUMENTS

| | | | |
|---|---|---|---|
| CN | 1957437 B | * | 12/2011 |
| JP | H06204339 A | * | 7/1994 |
| JP | 2003204237 A | * | 7/2002 |
| JP | 2016149650 A | | 8/2016 |
| RU | 2408476 C2 | | 1/2011 |
| RU | 2013115045 A | | 10/2014 |
| SU | 1748208 A1 | | 7/1992 |

* cited by examiner

*Primary Examiner* — Dinh T Le
(74) *Attorney, Agent, or Firm* — Adibi IP Group, PC; Amir V. Adibi; Andrew C. Palmer

(57) ABSTRACT

A circuit comprises a power source, an Open Loop Reactance Matching Circuit Control Signal Generator (OLRMCCSG), an Open Loop Reactance Matching (OLRM) circuit, and a load. The power source supplies an input voltage and an input current used to drive the load. The load is an inductive type load or a capacitive type load. If the power source operates as a voltage source, then the OLRMCCSG uses input voltage information to control the OLRM circuit to generate a reactance matching voltage that is phase delayed with respect to the input voltage. If the power source operates as a current source, then the OLRMCCSG uses input current information to control the OLRM circuit to generate a reactance matching current that is phase delayed with respect to the input current. The reactance matching voltage or the reactance matching current causes the input voltage and the input current to be in phase.

19 Claims, 30 Drawing Sheets

OPEN LOOP REACTANCE MATCHING CIRCUIT
(SERIES EMBODIMENT)

OPEN LOOP REACTANCE MATCHING CIRCUIT (SERIES EMBODIMENT)

INDUCTIVE LOAD

CAPACITIVE LOAD

OPEN LOOP REACTANCE MATCHING CIRCUIT
(PARALLEL EMBODIMENT)

CAPACITIVE LOAD

INDUCTIVE LOAD

| REACTANCE MATCHING CIRCUIT TYPE | COMPENS. SIGNAL | LOAD TYPE | PHASE DELAY OF COMPENSATION SIGNAL WITH RESPECT TO SUPPLY SIGNAL |
|---|---|---|---|
| SERIES | INJECTED VOLTAGE ($V_{RM}$) | INDUCTIVE | 90° LEAD ($V_{RM}$ LEADS $V_{IN}$ BY 90°) |
| SERIES | INJECTED VOLTAGE ($V_{RM}$) | CAPACITIVE | 90° LAG ($V_{RM}$ LAGS $V_{IN}$ BY 90°) |
| PARALLEL | INJECTED CURRENT ($I_{RM}$) | INDUCTIVE | 90° LAG ($I_{RM}$ LAGS $I_{IN}$ BY 90°) |
| PARALLEL | INJECTED CURRENT ($I_{RM}$) | CAPACITIVE | 90° LEAD ($I_{RM}$ LEADS $I_{IN}$ BY 90°) |

CONTROL OF REACTANCE MATCHING CIRCUIT
CONTROL SIGNAL GENERATOR

FIG. 7

OLRM CIRCUIT THAT COMPENSATES FOR BOTH
CAPACITIVE AND INDUCTIVE LOADS
(SERIES EMBODIMENT)

OLRM CIRCUIT THAT COMPENSATES FOR BOTH
CAPACITIVE AND INDUCTIVE LOADS
(PARALLEL EMBODIMENT)

OLRM CIRCUIT THAT COMPENSATES FOR BOTH
CAPACITIVE AND INDUCTIVE LOADS
(SERIES & PARALLEL EMBODIMENT)

SERIES REACTANCE MATCHING CIRCUIT

SERIES REACTANCE MATCHING FULL-BRIDGE

WAVEFORM DIAGRAMS FOR FIG. 12
(INDUCTIVE LOAD OPERATION)

WAVEFORM DIAGRAMS FOR FIG. 12
(CAPACITIVE LOAD OPERATION)

SERIES REACTANCE MATCHING HALF-BRIDGE

WAVEFORM DIAGRAMS FOR FIG. 15
(INDUCTIVE LOAD OPERATION)

WAVEFORM DIAGRAMS FOR FIG. 15
(CAPACITIVE LOAD OPERATION)

PARALLEL REACTANCE MATCHING CIRCUIT

PARALLEL REACTANCE MATCHING FULL-BRIDGE

GATE SIGNAL GENERATOR CIRCUIT

WAVEFORM DIAGRAMS FOR FIG. 19
(INDUCTIVE LOAD OPERATION)

WAVEFORM DIAGRAMS FOR FIG. 19
(CAPACITIVE LOAD OPERATION)

PARALLEL REACTANCE MATCHING HALF-BRIDGE
(INDUCTIVE LOAD)

GATE SIGNAL GENERATOR CIRCUIT

WAVEFORM DIAGRAMS FOR FIG. 23
(INDUCTIVE LOAD OPERATION)

WAVEFORM DIAGRAMS FOR FIG. 23
(CAPACITIVE LOAD OPERATION)

SERIES AND PARALLEL REACTANCE MATCHING CIRCUIT

SERIES AND PARALLEL REACTANCE MATCHING
HALF-BRIDGE

WAVEFORM DIAGRAMS THAT GENERATE REACTANCE MATCHING VOLTAGE IN FIG. 28

WAVEFORM DIAGRAMS THAT GENERATE REACTANCE MATCHING CURRENT IN FIG. 28

MULTIPLE SERIES REACTANCE MATCHING CIRCUIT
(DRIVES BOTH INDUCTIVE OR CAPACITIVE LOADS)

MULTIPLE SERIES REACTANCE MATCHING CIRCUIT
(DRIVES BOTH INDUCTIVE OR CAPACITIVE LOADS)

WAVEFORM DIAGRAMS FOR FIG. 32
(INDUCTIVE OR CAPACITIVE LOAD OPERATION)

MULTIPLE PARALLEL REACTANCE MATCHING HALF-BRIDGE
(DRIVES BOTH INDUCTIVE OR CAPACITIVE LOADS)

MULTIPLE PARALLEL REACTANCE MATCHING HALF-BRIDGE
(DRIVES BOTH INDUCTIVE OR CAPACITIVE LOADS)

GATE SIGNAL GENERATOR CIRCUIT

WAVEFORM DIAGRAMS FOR FIG. 35
(INDUCTIVE OR CAPACITIVE LOAD OPERATION)

MULTIPLE SERIES REACTANCE MATCHING
HALF-BRIDGE

GATE SIGNAL GENERATOR CIRCUIT

WAVEFORM DIAGRAMS FOR FIG. 38
(INDUCTIVE OR CAPACITIVE LOAD OPERATION)

US 11,539,348 B1

OPEN LOOP REACTANCE MATCHING CIRCUITRY

CROSS REFERENCE TO RELATED APPLICATIONS

This application claims the benefit under 35 U.S.C. §119 from U.S. Provisional Patent Application Ser. No. 62/909,854, entitled "Open Loop Reactance Matching (OLRM) and Application for Wireless Power Transfer," filed on Oct. 3, 2019, the subject matter of which is incorporated herein by reference.

TECHNICAL FIELD

The present invention relates generally to power electronics, and more specifically, to reactance matching circuitry and techniques.

BACKGROUND INFORMATION

Power circuits generally include a power source and a load. Electrical energy is output from the power source in the form of Direct Current (DC) or Alternating Current (AC) power that is supplied to and used to drive the load. The load has an input impedance and an output impedance. To maximize transfer of power to the load, it is desirable to design power circuitry such that the input impedance of the load matches the output impedance. This is referred to in power electronics as impedance matching or reactance matching. Impedance or reactance matching is often desirable to increase the overall efficiency of power circuitry.

SUMMARY

A circuit comprises a power source, an Open Loop Reactance Matching Circuit Control Signal Generator (OLRMCCSG), an Open Loop Reactance Matching (OLRM) circuit, and a load. The power source supplies an input voltage and an input current used to drive the load. The load is an inductive type load or a capacitive type load. If the power source operates as a voltage source, then the OLRMCCSG uses input voltage information to control the OLRM circuit to generate a reactance matching voltage that is phase delayed with respect to the input voltage. The reactance matching voltage causes the input voltage and the input current to be in phase. If the power source operates as a current source, then the OLRMCCSG uses input current information to control the OLRM circuit to generate a reactance matching current that is phase delayed with respect to the input current. The reactance matching current causes the input voltage and the input current to be in phase.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 7 is a diagram showing operation and control characteristics of the OLRMC.

DETAILED DESCRIPTION

Reference will now be made in detail to some embodiments of the invention, examples of which are illustrated in the accompanying drawings.

Figure 1:
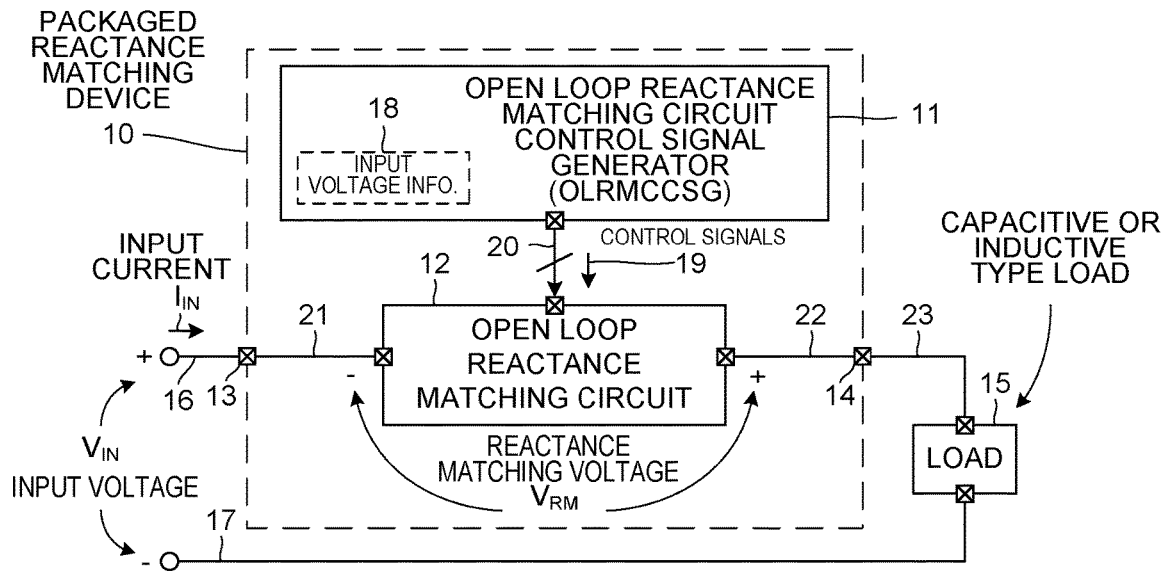
FIG. 1 is a circuit diagram of one embodiment of a packaged reactance matching device 10.

FIG. 1 is a circuit diagram of one embodiment of a packaged reactance matching device 10. The packaged reactance matching device 10 comprises an Open Loop Reactance Matching Circuit Control Signal Generator (OLRMCCSG) 11, an Open Loop Reactance Matching Circuit (OLRMC) 12, a first package terminal 13, and a second package terminal 14. The packaged reactance matching device 10 receives an input current IIN and input voltage VIN, and the packaged reactance matching device 10 drives a load 15. The OLRMCCSG 11 controls the OLRMC 12 such that the input current IIN and the input voltage VIN are in phase with each other while driving the load 15.

In this embodiment, the packaged reactance matching device 10 is coupled in series with the load 15. The load 15 is an inductive type load or a capacitive type load. How the OLRMCCSG 11 controls the OLRMC 12 is determined in part on whether the load 15 is an inductive type of load or a capacitive type load. In one embodiment, the packaged reactance matching device 10 comprises a microcontroller. In another embodiment, the packaged reactance matching device 10 is formed from entirely discrete circuit components. In yet another embodiment, the packaged reactance matching device 10 comprises an integrated circuit that includes no processor that processes computer readable instructions.

During operation, the input current IIN is supplied onto the first package terminal 13 of the packaged reactance matching device 10 via conductor 16 and the input voltage VIN is present between conductors 16 and 17. The OLRMCCSG 11 uses input voltage information 18 to generate control signals 19. The OLRMCCSG 11 supplies the generated control signals 19 to the OLRMC 12 via conductors 20. The control signals 19 cause the OLRMC 12 to generate a reactance matching voltage VRM between an input conductor 21 and an output conductor 22. In other embodiments, the reactance matching voltage VRM may also be referred to as an "impedance matching voltage". A load current ILOAD flows from the output conductor 22, through the second package terminal 14, and onto the load 15 via conductor 23.

The reactance matching voltage VRM generated by the OLRMC 12 causes the input voltage VIN and the input current IIN to be in phase. The OLRMCCSG 11 controls the OLRMC 12 to generate the reactance matching voltage VRM with only input voltage information 18. The input voltage information 18 is obtained through one of various techniques depending on how the packaged reactance matching device 10 is used. In one embodiment, the input voltage information 18 is sensed, for example by sensing a voltage on the input conductor 21. In another embodiment, the input voltage information 18 is received onto the OLRMCCSG 11, for example via one or more digital signals supplied onto one or more control terminals of the OLRMCCSG 11. In yet another embodiment, the input voltage information 18 is generated by the OLRMCCSG 11 and is used to control a power converter coupled between the first package terminal 13 and a power source. For example, the OLRMCCSG 11 controls an amplifier coupled to a power source such that the amplifier generates the input voltage and input current supplied to the packaged reactance matching device 10. In each of the above embodiments, the input voltage information 18 is used to generate the control signals 19 that control the OLRMC 12 to generate the reactance matching voltage VRM.

In accordance with at least one novel aspect, the OLRMCCSG 11 controls the OLRMC 12 to generate the reactance matching voltage VRM without any feedback from the load 15. The OLRMCCSG 11 controls the OLRMC 12 to generate the reactance matching voltage VRM without any sensing of the load current ILOAD 15. The OLRMCCSG 11 controls the OLRMC 12 to generate the reactance matching voltage VRM without any current or voltage sensing on the output conductor 22. This feedback-less feature of the OLRMCCSG 11 and OLRMC 12 is why they are referred to as being "open loop". It is appreciated that this feedback-less feature reduces significant cost and complexity in the manufacture and operation of the packaged reactance matching device 10 as compared to other conventional reactance matching circuitry.

In accordance with at least another novel aspect, the control signals 19 generated by the OLRMCCSG 11 are generated based in part on whether the load 15 is an inductive type load or a capacitive type load. If the load 15 is an inductive type of load, then the reactance matching voltage VRM is generated to be phase delayed with respect to the input voltage VIN such that a phase of the reactance matching voltage VRM leads (or is ahead of) a phase of the input voltage VIN by ninety-degrees)(90° (or) π/2 If the load 15 is a capacitive type of load, then the reactance matching voltage VRM is generated to be phase delayed with respect to the input voltage VIN such that a phase of the reactance matching voltage VRM lags (or is behind) a phase of the input voltage VIN by ninety-degrees)(90°) (or π/2). In either capacitive or inductive type loads, the phase delayed aspect of the reactance matching voltage VRM causes the input voltage VIN and the input current IIN to be in phase. It is appreciated that phase matching of the input voltage VIN and the input current IIN results in greater operational efficiency than if the input voltage VIN and the input current IIN were not in phase.

Figure 2:
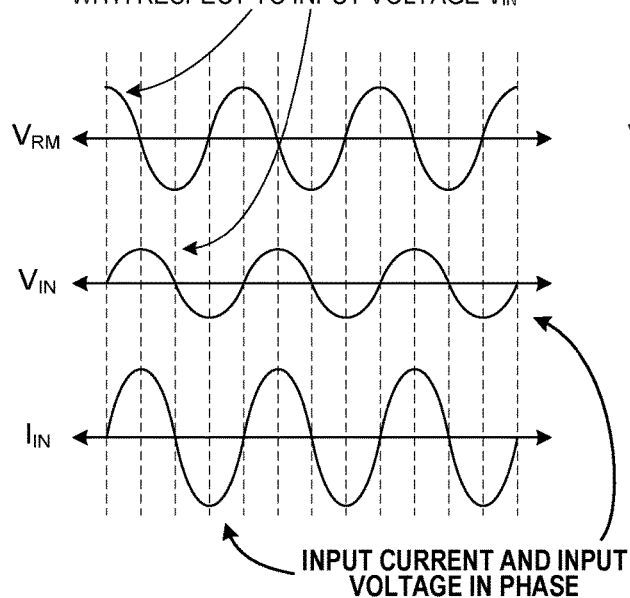
FIG. 2 is a diagram of waveforms of the reactance matching voltage VRM, the input voltage VIN, and the input current IIN when the packaged reactance matching device 10 is driving an inductive type of load 15.

FIG. 2 is a diagram of waveforms of the reactance matching voltage VRM, the input voltage VIN, and the input current IIN when the packaged reactance matching device 10 is driving an inductive type of load 15. The reactance matching voltage VRM is phase delayed with respect to the input voltage VIN such that a phase of the reactance matching voltage VRM leads ahead of a phase of the input voltage VIN by ninety-degrees)(90°). The reactance matching voltage VRM causes the input voltage VIN and the input current IIN to be in phase. It is appreciated that the waveforms shown in FIG. 2 represent steady state operation of the packaged reactance matching device 10 while the packaged reactance matching device 10 is driving an inductive type load 15.

Figure 3:
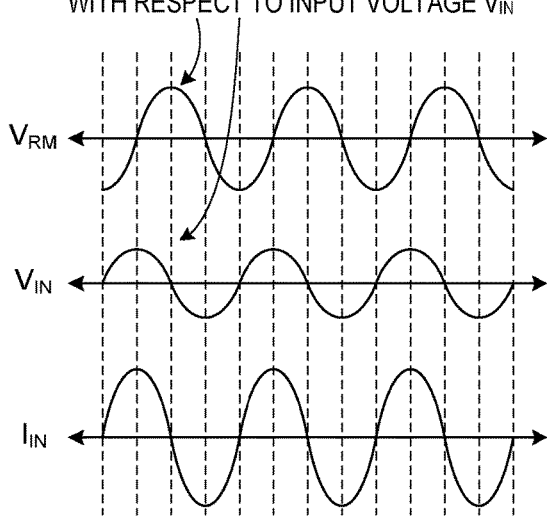
FIG. 3 is a diagram of waveforms of the reactance matching voltage VRM, the input voltage VIN, and the input current IIN when the packaged reactance matching device 10 is driving a capacitive type of load 15.

FIG. 3 is a diagram of waveforms of the reactance matching voltage VRM, the input voltage VIN, and the input current IIN when the packaged reactance matching device 10 is driving a capacitive type of load 15. The reactance matching voltage VRM is phase delayed with respect to the input voltage VIN such that a phase of the reactance matching voltage VRM lags behind a phase of the input voltage VIN by ninety-degrees) (90°). The reactance matching voltage VRM causes the input voltage VIN and the input current IIN to be in phase. It is appreciated that the waveforms shown in FIG. 3 represent steady state operation of the packaged reactance matching device 10 while the packaged reactance matching device 10 is driving a capacitive type load 15.

Figure 4:
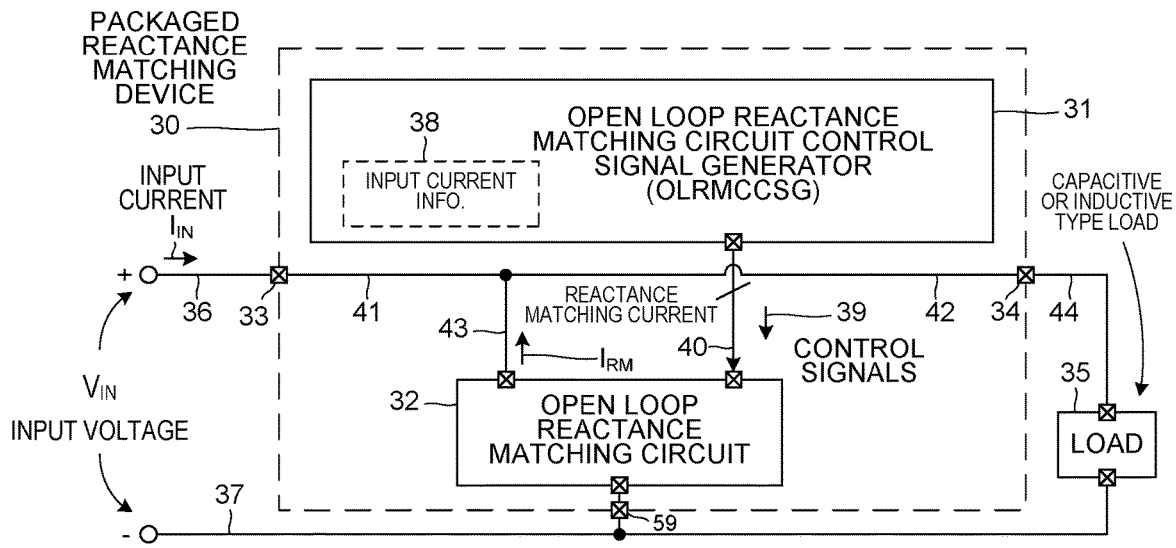
FIG. 4 is a circuit diagram of another embodiment of a packaged reactance matching device 30.

FIG. 4 is a circuit diagram of another embodiment of a packaged reactance matching device 30. The packaged reactance matching device 30 comprises an Open Loop Reactance Matching Circuit Control Signal Generator (OLRMCCSG) 31, an Open Loop Reactance Matching Circuit (OLRMC) 32, a first package terminal 33, a second package terminal 34, and a third package terminal 59. The packaged reactance matching device 30 receives an input current TIN and input voltage VIN, and the packaged reactance matching device 30 drives a load 35. The OLRMCCSG 31 controls the OLRMC 32 such that the input current TIN and the input voltage VIN are in phase with each other while driving the load 35.

In this embodiment, the packaged reactance matching device 30 is coupled in parallel with the load 35. The load 35 is an inductive type load or a capacitive type load. How the OLRMCCSG 31 controls the OLRMC 32 is determined in part on whether the load 35 is an inductive type of load or a capacitive type load. In one embodiment, the packaged reactance matching device 30 comprises a microcontroller. In another embodiment, the packaged reactance matching device 30 is formed from entirely discrete circuit components. In yet another embodiment, the packaged reactance matching device 30 comprises an integrated circuit that includes no processor that processes computer readable instructions.

During operation, the input current IIN is supplied onto the first package terminal 33 of the packaged reactance matching device 30 via conductor 36 and the input voltage VIN is present between conductors 36 and 37. The OLRMCCSG 31 uses input current information 38 to generate control signals 39. The OLRMCCSG 31 supplies the generated control signals 39 to the OLRMC 32 via conductors 40. The control signals 39 cause the OLRMC 32 to generate a reactance matching current IRM. An input conductor 41 is divided into an output conductor 42 and a reactance matching current conductor 43. The OLRMC receives the reactance matching current IRM via the reactance matching current conductor 43. In other embodiments, the reactance matching current IRM may also be referred to as an "impedance matching current". A load current ILOAD flows from the output conductor 42, through the second package terminal 34, and onto the load 35 via conductor 44.

The reactance matching current IRM generated by the OLRMC 32 causes the input voltage VIN and the input current IIN to be in phase. The OLRMCCSG 31 controls the OLRMC 32 to generate the reactance matching current IRM with only input current information 38. The input current information 38 is obtained through one of various techniques depending on how the packaged reactance matching device 30 is used. In one embodiment, the input current information 38 is sensed, for example by sensing a current on the input conductor 41. In another embodiment, the input current information 38 is received onto the OLRMCCSG 31, for example via one or more digital signals supplied onto one or more control terminals of the OLRMCCSG 31. In yet another embodiment, the input voltage information 38 is generated by the OLRMCCSG 31 and is used to control a power converter coupled between the first package terminal 33 and a power source. For example, the OLRMCCSG 31 controls an amplifier coupled to a power source such that the amplifier generates the input voltage and input current supplied to the packaged reactance matching device 30. In each of the above embodiments, the input current information 38 is used to generate the control signals 39 that control the OLRMC 32 to generate the reactance matching current IRM.

In accordance with at least one novel aspect, the OLRMCCSG 31 controls the OLRMC 32 to generate the reactance matching current IRM without any feedback from the load 35. The OLRMCCSG 31 controls the OLRMC 32 to generate the reactance matching current IRM without any sensing of the load current ILOAD 35. The OLRMCCSG 31 controls the OLRMC 32 to generate the reactance matching current IRM without any current or voltage sensing on the output conductor 42. This feedback-less feature of the OLRMCCSG 31 and OLRMC 32 is why they are referred to as being "open loop". It is appreciated that this feedback-less feature reduces significant cost and complexity in the manufacture and operation of the packaged reactance matching device 30 as compared to other conventional reactance matching circuitry.

In accordance with at least another novel aspect, the control signals 39 generated by the OLRMCCSG 31 are generated based in part on whether the load 35 is an inductive type load or a capacitive type load. If the load 35 is an capacitive type of load, then the reactance matching current IRM is generated to be phase delayed with respect to the input current IIN such that a phase of the reactance matching current IRM leads (or is ahead of) a phase of the input current IIN by ninety-degrees)(90°) (or π/2). If the load 35 is a inductive type of load, then the reactance matching current IRM is generated to be phase delayed with respect to the input current IIN such that a phase of the reactance matching current IRM lags (or is behind) a phase of the input current IIN by ninety-degrees)(90°) (or π/2). In either capacitive or inductive type loads, the phase delayed aspect of the reactance matching current IRM causes the input voltage VIN and the input current IIN to be in phase. It is appreciated that phase matching of the input voltage VIN and the input current IIN results in greater operational efficiency than if the input voltage VIN and the input current IIN were not in phase.

Figure 5:
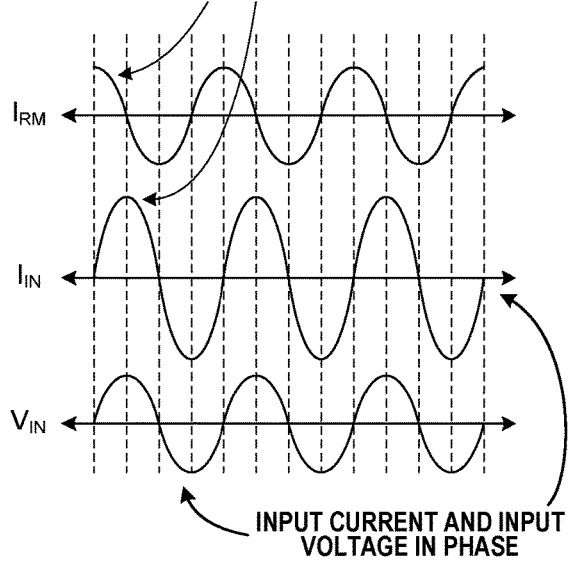
FIG. 5 is a diagram of waveforms of the reactance matching current IRM, the input current IIN, and the input voltage VIN when the packaged reactance matching device 30 is driving a capacitive type of load 35.

FIG. 5 is a diagram of waveforms of the reactance matching current IRM, the input current IIN, and the input voltage VIN when the packaged reactance matching device 30 is driving a capacitive type of load 35. The reactance matching current IRM is phase delayed with respect to the input current IIN such that a phase of the reactance matching current IRM leads ahead of a phase of the input current IIN by ninety-degrees) (90°). The reactance matching current IRM causes the input voltage VIN and the input current IIN to be in phase. It is appreciated that the waveforms shown in FIG. 5 represent steady state operation of the packaged reactance matching device 30 while the packaged reactance matching device 30 is driving a capacitive type load 35.

Figure 6:
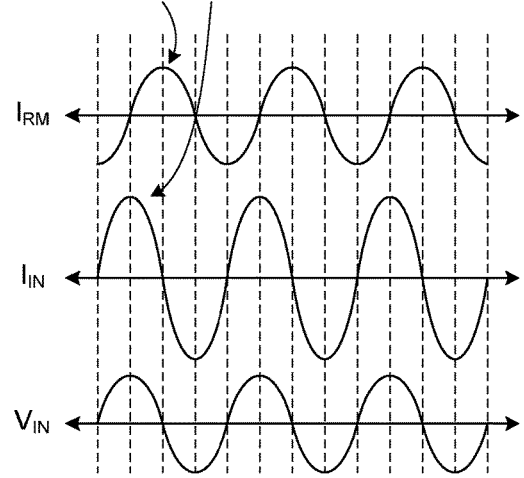
FIG. 6 is a diagram of waveforms of the reactance matching current IRM, the input current IIN, and the input voltage VIN when the packaged reactance matching device 30 is driving an inductive type of load 35.

FIG. 6 is a diagram of waveforms of the reactance matching current IRM, the input current IIN, and the input voltage VIN when the packaged reactance matching device 30 is driving an inductive type of load 35. The reactance matching current IRM is phase delayed with respect to the input current IIN such that a phase of the reactance matching current IRM lags behind a phase of the input current IIN by ninety-degrees (90°). The reactance matching current IRM causes the input voltage VIN and the input current IIN to be in phase. It is appreciated that the waveforms shown in FIG. 6 represent steady state operation of the packaged reactance matching device 30 while the packaged reactance matching device 30 is driving inductive type load 35.

FIG. 7 is a diagram 45 showing operation and control characteristics of the OLRMC. Rows 46 and 47 show operational characteristics when the OLRMC is in series with a load. The operational characteristics shown in row 46 correspond to the waveforms shown in FIG. 2 where the OLRMC 12 is in series with an inductive type load 15. The operational characteristics shown in row 47 correspond to the waveforms shown in FIG. 3 where the OLRMC 12 is in series with a capacitive type load 15. Rows 48 and 49 show operational characteristics when the OLRMC is in parallel with a load. The operational characteristics shown in row 48 correspond to the waveforms shown in FIG. 5 where the OLRMC 32 is in parallel with a capacitive type load 35. The operational characteristics shown in row 49 correspond to the waveforms shown in FIG. 6 where the OLRMC 32 is in parallel with an inductive type load 35.

Figure 8:
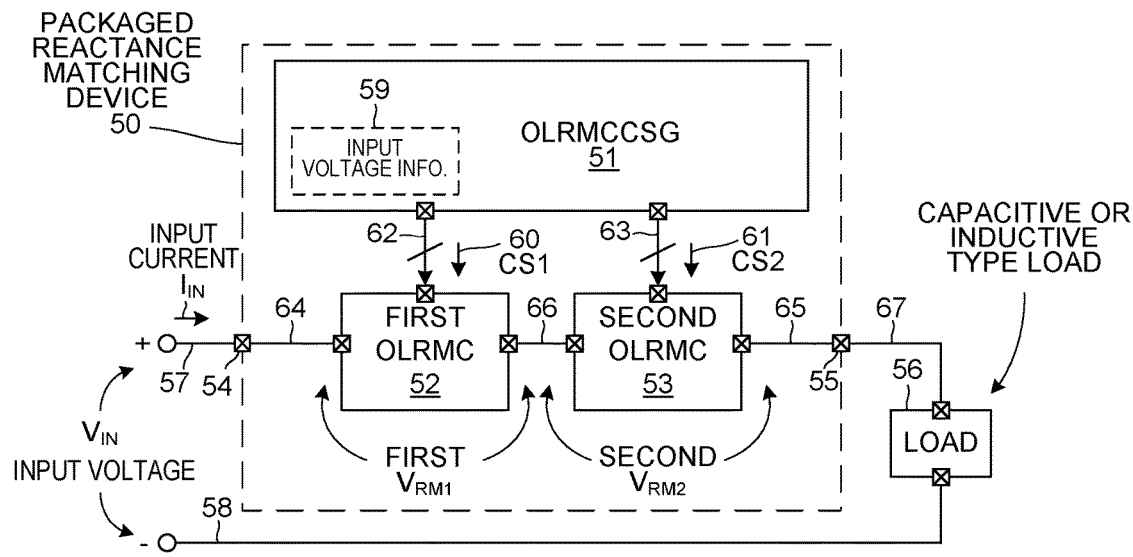
FIG. 8 is a diagram of another embodiment of a packaged reactance matching device 50.

FIG. 8 is a diagram of another embodiment of a packaged reactance matching device 50. The packaged reactance matching device 50 comprises an Open Loop Reactance Matching Circuit Control Signal Generator (OLRMCCSG) 51, a first Open Loop Reactance Matching Circuit (OLRMC) 52, a second OLRMC 53, a first package terminal 54, and a second package terminal 55. The packaged reactance matching device 50 receives an input current TIN and input voltage VIN, and the packaged reactance matching device 50 drives a load 56. The OLRMCCSG 51 controls the first OLRMC 52 and the second OLRMC 53 such that the input current IIN and the input voltage VIN are in phase with each other while driving the load 56.

In this embodiment, the packaged reactance matching device 50 is coupled in series with the load 56. The load 56 may be either an inductive type load or a capacitive type load. In the example of FIG. 8, it does not matter whether the load 56 is an inductive type of load or a capacitive type load. By using the two OLRMCs 52 and 53, the OLRMCCSG 51 operates to maintain the input current TIN in phase with the input voltage VIN regardless of whether the load 56 is an inductive type of load or a capacitive type load.

In one embodiment, the packaged reactance matching device 50 comprises a microcontroller. In another embodiment, the packaged reactance matching device 50 is formed from entirely discrete circuit components. In yet another embodiment, the packaged reactance matching device 50 comprises an integrated circuit that includes no processor that processes computer readable instructions.

During operation, the input current IIN is supplied onto the first package terminal 54 of the packaged reactance matching device 50 via conductor 57 and the input voltage VIN is present between conductors 57 and 58. The OLRMCCSG 51 uses input voltage information 59 to generate first control signals 60 and second control signals 61. The OLRMCCSG 51 supplies the generated first control signals 60 to the first OLRMC 52 via conductors 62. The OLRMCCSG 51 supplies the generated second control signals 61 to the second OLRMC 53 via conductors 63. The first OLRMC 52 and the second OLRMC 53 are coupled in series between the input conductor 64 and the output conductor 65 via conductor 66. The first control signals 60 cause the first OLRMC 52 to generate first reactance matching voltage VRM1. The second control signals 61 cause the second OLRMC 53 to generate a second reactance matching voltage VRM2. A load current ILOAD flows from the output conductor 65, through the second package terminal 55, and onto the load 56 via conductor 67.

The reactance matching voltages VRM1 and VRM2 generated by the first OLRMC 52 and the second OLRMC 53 causes the input voltage VIN and the input current IIN to be in phase, regardless of whether the load 56 is an inductive type load or a capacitive type load. The OLRMCCSG 51 controls the first OLRMC 52 and the second OLRMC 53 to generate the reactance matching voltages VRM1 and VRM2 with only input voltage information 59. The input voltage information 59 is obtained through one of various techniques depending on how the packaged reactance matching device 50 is used. In one embodiment, the input voltage information 59 is sensed, for example by sensing a voltage on the input conductor 64. In another embodiment, the input voltage information 59 is received onto the OLRMCCSG 51, for example via one or more digital signals supplied onto one or more control terminals of the OLRMCCSG 51. In yet another embodiment, the input voltage information 59 is generated by the OLRMCCSG 51 and is used to control a power converter coupled between the first package terminal 54 and a power source. For example, the OLRMCCSG 51 controls an amplifier coupled to a power source such that the amplifier generates the input voltage and input current supplied to the packaged reactance matching device 50. In each of the above embodiments, the input voltage information 59 is used to generate the first control signals 60 and the second control signals 61 to generate the reactance matching voltages VRM1 and VRM2.

In accordance with at least one novel aspect, the OLRMCCSG 51 controls the first OLRMC 52 and the second OLRMC 53 to generate the reactance matching voltages VRM1 and VRM2 without any feedback from the load 56. The OLRMCCSG 51 controls the first OLRMC 52 and the second OLRMC 53 to generate the reactance matching voltages VRM1 and VRM2 without any sensing of the load current ILOAD. The OLRMCCSG 51 controls the first OLRMC 52 and the second OLRMC 53 to generate the reactance matching voltages VRM1 and VRM2 without any current or voltage sensing on the output conductor 65. This feedback-less feature of the OLRMCCSG 51, first OLRMC 52, and the second OLRMC 53 is why they are referred to as being "open loop". It is appreciated that this feedback-less feature reduces significant cost and complexity in the manufacture and operation of the packaged reactance matching device 50 as compared to other conventional reactance matching circuitry.

In accordance with at least another novel aspect, the packaged reactance matching device 50 serves dual-mode operation in that the packaged reactance matching device 50 drives both inductive or capacitive loads without any re-configuration of the OLRMCCSG 51. The first control signals 60 are generated assuming load 56 is an inductive type load. The second control signals 61 are generated assuming load 56 is a capacitive type load. The first reactance matching voltage VRM1 is generated to be phase delayed with respect to the input voltage VIN such that a phase of the first reactance matching voltage VRM leads (or is ahead of) a phase of the input voltage VIN by ninety-degrees(90°) (or $\pi/2$). The second reactance matching voltage VRM is generated to be phase delayed with respect to the input voltage VIN such that a phase of the reactance matching voltage VRM lags (or is behind) a phase of the input voltage VIN by ninety-degrees(90°) (or $\pi/2$). In this way, the packaged reactance matching device 50 serves dual-mode operation in that the packaged reactance matching device 50 drives both inductive or capacitive loads without in any way altering the operation of the OLRMCCSG 51. In either capacitive or inductive type loads, the phase delayed aspect of the reactance matching voltages VRM1 and VRM2 causes the input voltage VIN and the input current IIN to be in phase. It is appreciated that phase matching of the input voltage VIN and the input current IIN results in greater operational efficiency than if the input voltage VIN and the input current IIN were not in phase.

Figure 9:
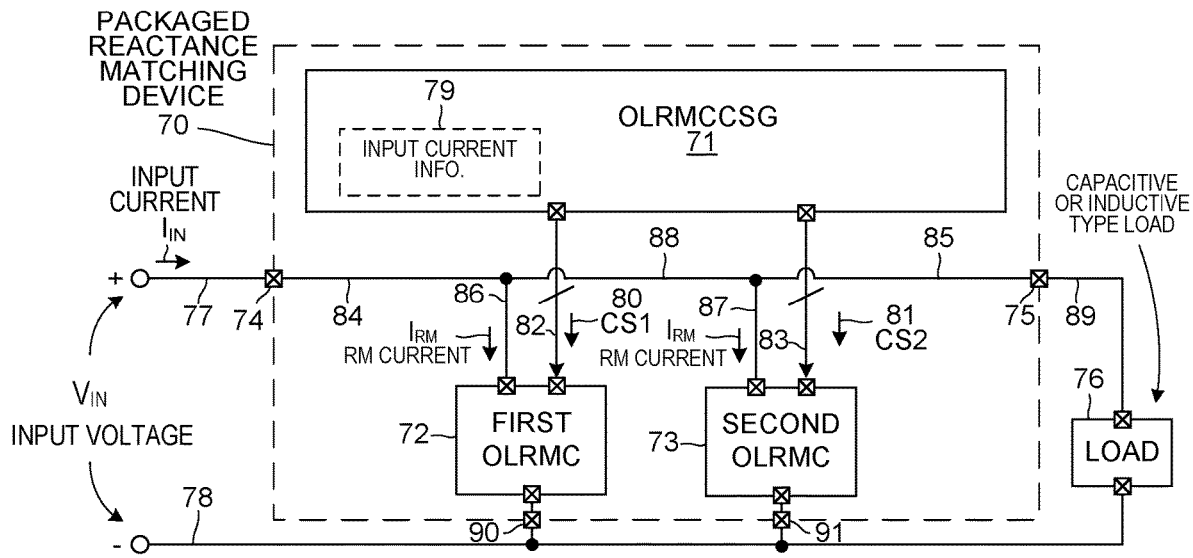
FIG. 9 is a diagram of another embodiment of a packaged reactance matching device 70.

FIG. 9 is a diagram of another embodiment of a packaged reactance matching device 70. The packaged reactance matching device 70 comprises an Open Loop Reactance Matching Circuit Control Signal Generator (OLRMCCSG) 71, a first Open Loop Reactance Matching Circuit (OLRMC) 72, a second OLRMC 73, a first package terminal 74, a second package terminal 75, a third package terminal 90, and a fourth package terminal 91. The packaged reactance matching device 70 receives an input current IIN and input voltage VIN, and the packaged reactance matching device 70 drives a load 76. The OLRMCCSG 71 controls the first OLRMC 72 and the second OLRMC 73 such that the input current IIN and the input voltage VIN are in phase with each other while driving the load 76.

In this embodiment, the packaged reactance matching device 70 is coupled in parallel with the load 76. The load 76 may be either an inductive type load or a capacitive type load. In the example of FIG. 9, it does not matter whether the load 76 is an inductive type of load or a capacitive type load. By using the two OLRMCs 72 and 73, the OLRMCCSG 71 operates to maintain the input current IIN in phase with the input voltage VIN regardless of whether the load 76 is an inductive type of load or a capacitive type load.

In one embodiment, the packaged reactance matching device 70 comprises a microcontroller. In another embodiment, the packaged reactance matching device 70 is formed from entirely discrete circuit components. In yet another embodiment, the packaged reactance matching device 70 comprises an integrated circuit that includes no processor that processes computer readable instructions.

During operation, the input current IIN is supplied onto the first package terminal 74 of the packaged reactance matching device 70 via conductor 77 and the input voltage VIN is present between conductors 77 and 78. The OLRMCCSG 71 uses input current information 79 to generate first control signals 80 and second control signals 81. The OLRMCCSG 71 supplies the generated first control signals 80 to the first OLRMC 72 via conductors 82. The OLRMCCSG 71 supplies the generated second control signals 81 to the second OLRMC 73 via conductors 83. The first OLRMC 52 and the second OLRMC 53 are coupled in parallel between the input conductor 84 and the output conductor 85. The first control signals 80 cause a first reactance matching current IRM1 to be supplied to the first OLRMC 72 via first reactance matching current conductor 86. The second control signals 81 cause a second reactance matching current IRM2 to be supplied to the second OLRMC 73 via second reactance matching current conductor 87. Conductor 88 is coupled between the first reactance matching current conductor 86 and the second reactance matching current conductor 87. A load current ILOAD flows from the output conductor 85, through the second package terminal 75, and onto the load 76 via conductor 89.

The reactance matching currents IRM1 and IRM2 generated by the first OLRMC 72 and the second OLRMC 73 causes the input voltage VIN and the input current IIN to be in phase, regardless of whether the load 76 is an inductive type load or a capacitive type load. The OLRMCCSG 71 controls the first OLRMC 72 and the second OLRMC 73 to generate the reactance matching currents IRM1 and IRM2 with only input current information 79. The input current information 79 is obtained through one of various techniques depending on how the packaged reactance matching device 70 is used. In one embodiment, the input current information 79 is sensed, for example by sensing a current on the input conductor 84. In another embodiment, the input current information 79 is received onto the OLRMCCSG 71, for example via one or more digital signals supplied onto one or more control terminals of the OLRMCCSG 71. In yet another embodiment, the input current information 79 is generated by the OLRMCCSG 71 and is used to control a power converter coupled between the first package terminal 74 and a power source. For example, the OLRMCCSG 71 controls an amplifier coupled to a power source such that the amplifier generates the input voltage and input current supplied to the packaged reactance matching device 70. In each of the above embodiments, the input current information 79 is used to generate the first control signals 80 and the second control signals 81 to generate the reactance matching currents IRM1 and IRM2.

In accordance with at least one novel aspect, the OLRMCCSG 71 controls the first OLRMC 72 and the second OLRMC 73 to generate the reactance matching currents IRM1 and IRM2 without any feedback from the load 76. The OLRMCCSG 71 controls the first OLRMC 72 and the second OLRMC 73 to generate the reactance matching currents IRM1 and IRM2 without any sensing of the load current ILOAD. The OLRMCCSG 71 controls the first OLRMC 72 and the second OLRMC 73 to generate the reactance matching currents IRM1 and IRM2 without any current or voltage sensing on the output conductor 85. This feedback-less feature of the OLRMCCSG 71, first OLRMC 72, and the second OLRMC 73 is why they are referred to as being "open loop". It is appreciated that this feedback-less feature reduces significant cost and complexity in the manufacture and operation of the packaged reactance matching device 70 as compared to other conventional reactance matching circuitry.

In accordance with at least another novel aspect, the packaged reactance matching device 70 serves dual-mode operation in that the packaged reactance matching device 70 drives both inductive or capacitive loads without any re-configuration of the OLRMCCSG 71. The first control signals 80 are generated assuming load 76 is a capacitive type load. The second control signals 81 are generated assuming load 76 is an inductive type load. The first reactance matching current IRM1 is generated to be phase delayed with respect to the input current IIN such that a phase of the first reactance matching voltage VRM leads (or is ahead of) a phase of the input current IIN by ninety-degrees)(90°) (or π2/). The second reactance matching current IRM is generated to be phase delayed with respect to the input current IIN such that a phase of the reactance matching current IRM lags (or is behind) a phase of the input voltage VIN by ninety-degrees)(90°) (or π/2). In this way, the packaged reactance matching device 70 serves dual-mode operation in that the packaged reactance matching device 70 drives both inductive or capacitive loads without in any way altering the operation of the OLRMCCSG 71. In either capacitive or inductive type loads, the phase delayed aspect of the reactance matching currents IRM1 and IRM2 causes the input voltage VIN and the input current IIN to be in phase. It is appreciated that phase matching of the input voltage VIN and the input current IIN results in greater operational efficiency than if the input voltage VIN and the input current IIN were not in phase.

Figure 10:
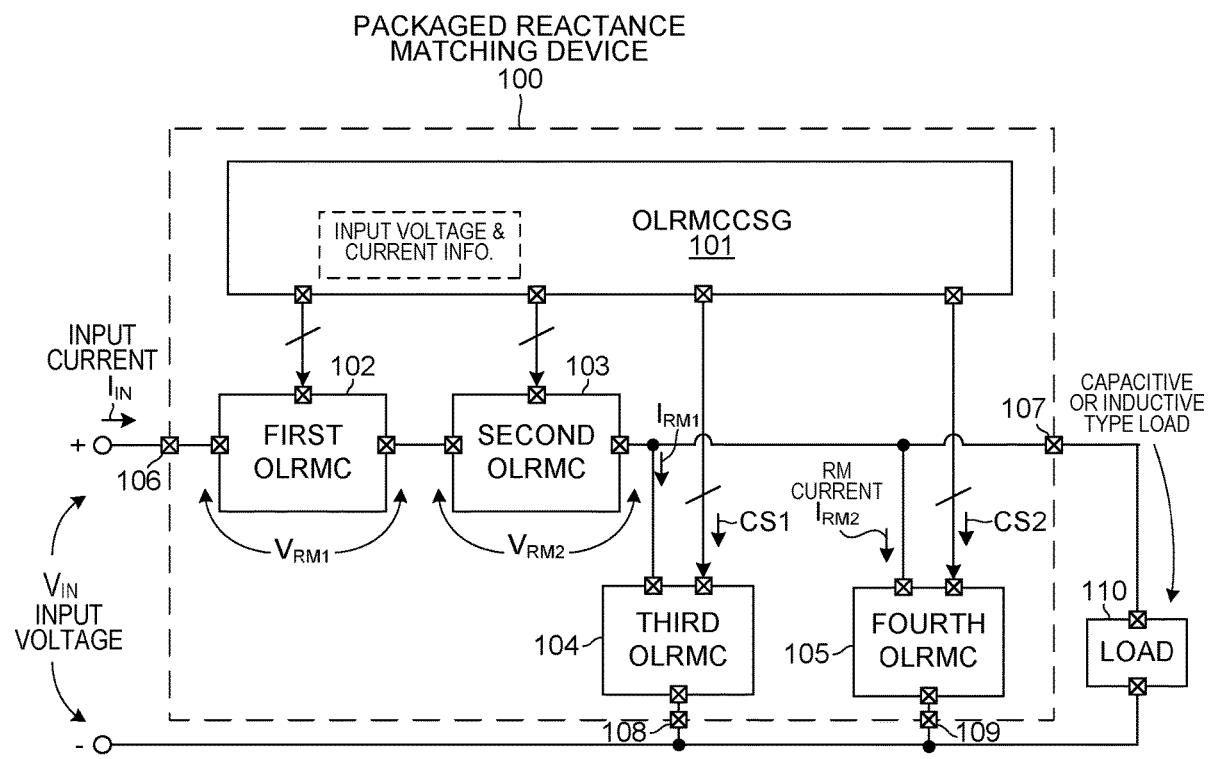
FIG. 10 is a diagram of another embodiment of a packaged reactance matching device 100.

FIG. 10 is a diagram of another embodiment of a packaged reactance matching device 100. The packaged reactance matching device 100 is operable to receive either a current source or voltage source supply and to drive either an inductive or capacitive load without any re-configuration or alteration of control. The packaged reactance matching device 100 implements both design topologies shown in FIGS. 8 and 9. The packaged reactance matching device 100 comprises an Open Loop Reactance Matching Circuit Control Signal Generator (OLRMCCSG) 101, a first Open Loop Reactance Matching Circuit (OLRMC) 102, a second OLRMC 103, a third OLRMC 104, a fourth OLRMC 105, a first package terminal 106, a second package terminal 107, a third package terminal 108, and a fourth package terminal 109. The packaged reactance matching device 100 receives an input current IIN and input voltage VIN, and the packaged reactance matching device 100 drives a load 110. The OLRMCCSG 101 controls the first OLRMC 102, the second OLRMC 103, the third OLRMC 104, and the fourth OLRMC 105 such that the input current IIN and the input voltage VIN are in phase with each other while driving the load 110.

In this embodiment, the first OLRMC 102 and the second OLRMC 103 are coupled in series with the load 110, and the third OLRMC 104 and the fourth OLRMC 105 are coupled in parallel with the load 110. The load 110 may be either an inductive type load or a capacitive type load. In the example of FIG. 10, it does not matter whether the load 110 is an inductive type of load or a capacitive type load or whether the power source is a voltage source or current source. By using the four OLRMCs 102-105, the OLRMCCSG 101 operates to maintain the input current IIN in phase with the input voltage VIN regardless of load type or power source type.

Figure 11:
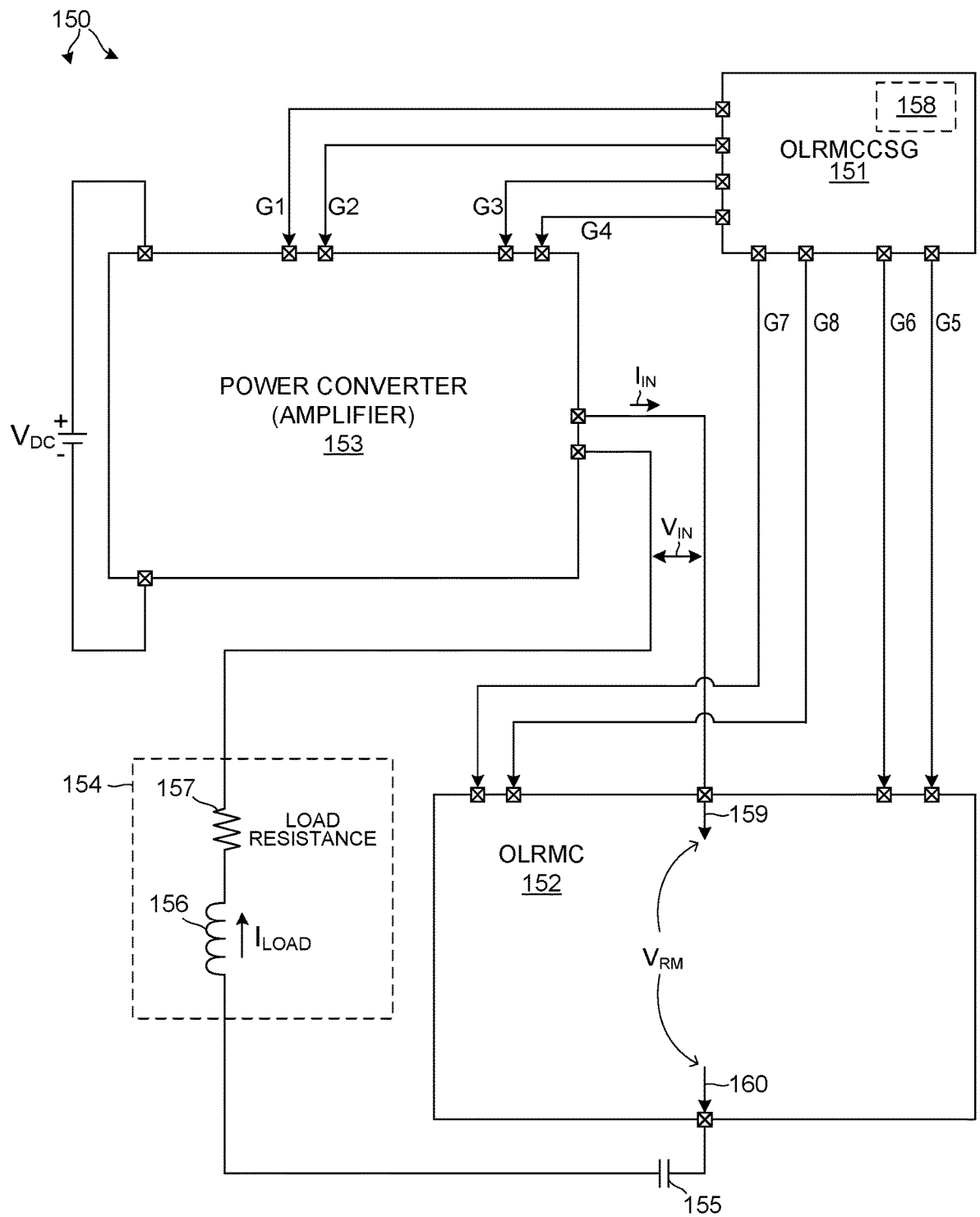
FIG. 11 is a circuit diagram of a circuit 150 having a OLRMCCSG 151 and an OLRMC 152 in a series configuration.

FIG. 11 is a circuit diagram of a circuit 150 having a OLRMCCSG 151 and an OLRMC 152 in a series configuration. The circuit 150 is realized using full-bridge circuit topologies. The circuit 150 comprises voltage source VDC, the OLRMCCSG 151, the OLRMC 152, a power converter 153, a load 154, and a capacitor 155. The load 154 includes an inductor 156 and a load resistance 157. In this example, the power converter is a power amplifier. Power amplifier 153 receives the supply voltage VDC and generates and outputs an input current IIN and an input voltage VIN. The OLRMCCSG 151 generates gate drive signals G1, G2, G3, and G4 that are supplied to and control amplifier 153. The OLRMCCSG 151 has input voltage information 158 from generation of the gate drive signals G1, G2, G3, and G4 which control generation of the input current IIN and the input voltage VIN. The OLRMCCSG 151 generates gate drive signals G5, G6, G7, and G8 that are supplied to and control the OLRMC 152. The OLRMC 152 generates a reactance matching voltage VRM between input conductor 159 and output conductor 160.

Figure 12:
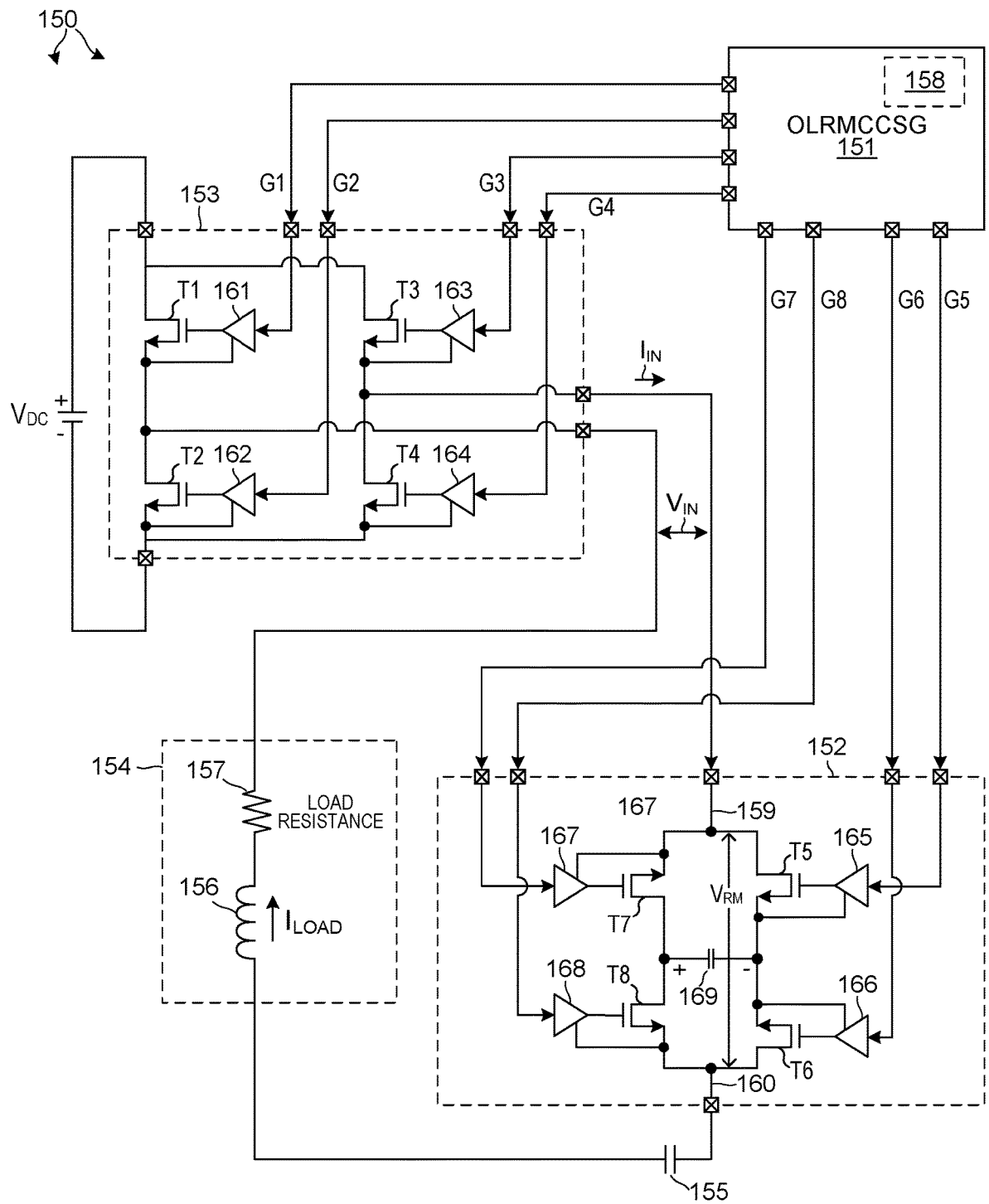
FIG. 12 is a more detailed circuit diagram of the circuit 150 shown in FIG. 11.

FIG. 12 is a more detailed circuit diagram of the circuit 150 shown in FIG. 11. The amplifier 153 comprises transistors T1, T2, T3, and T4 and gate drive circuits 161, 162, and 163, and 164. Gate drive circuit 161 receives the gate drive signal G1 and drives a gate of transistor T1. Gate drive circuit 162 receives the gate drive signal G2 and drives a gate of transistor T2. Gate drive circuit 163 receives the gate drive signal G3 and drives a gate of transistor T3. Gate drive circuit 164 receives the gate drive signal G4 and drives a gate of transistor T4. The OLRMCCSG 151 uses the input voltage information 158 to generate gate drive signals G1, G2, G3, and G4 to generate the desired input current IIN and input voltage VIN supplied to the OLRMC 152.

The OLRMC 152 comprises transistors T5, T6, T7, and T8, gate drive circuits 165, 166, and 167, and 168, and a capacitor 169. Gate drive circuit 165 receives the gate drive signal G5 and drives a gate of transistor T5. Gate drive circuit 166 receives the gate drive signal G6 and drives a gate of transistor T6. Gate drive circuit 167 receives the gate drive signal G7 and drives a gate of transistor T7. Gate drive circuit 168 receives the gate drive signal G8 and drives a gate of transistor T8. The gate drive signals G5, G6, G7, and G8 cause the OLRMC 152 to generate the reactance matching voltage VRM between input conductor 159 and output conductor 160. The reactance matching voltage VRM causes the input voltage VIN and the input current IIN to be in phase during steady state operation.

The OLRMCCSG 151 generates the gate drive signals G5, G6, G7, and G8 by phase shifting the gate drive signals G1, G2, G3, and G4 by ninety-degrees)(90°). If the load 154 is an inductive type load, then the OLRMCCSG 151 generates the gate drive signals G5, G6, G7, and G8 to be phase shifted ninety-degrees)(90° ahead of the amplifier gate drive signals G1, G2, G3, and G4. The gate drive signals G5, G6, G7, and G8 lead ahead of the amplifier gate drive signals G1, G2, G3, and G4 by ninety-degrees) (90°). If the load 154 is a capacitive type load, then the OLRMCCSG 151 generates the gate drive signals G5, G6, G7, and G8 to be phase shifted ninety-degrees)(90°) behind the amplifier gate drive signals G1, G2, G3, and G4. The gate drive signals G5, G6, G7, and G8 lag behind the amplifier gate drive signals G1, G2, G3, and G4 by ninety-degrees) (90°).

Figure 13:
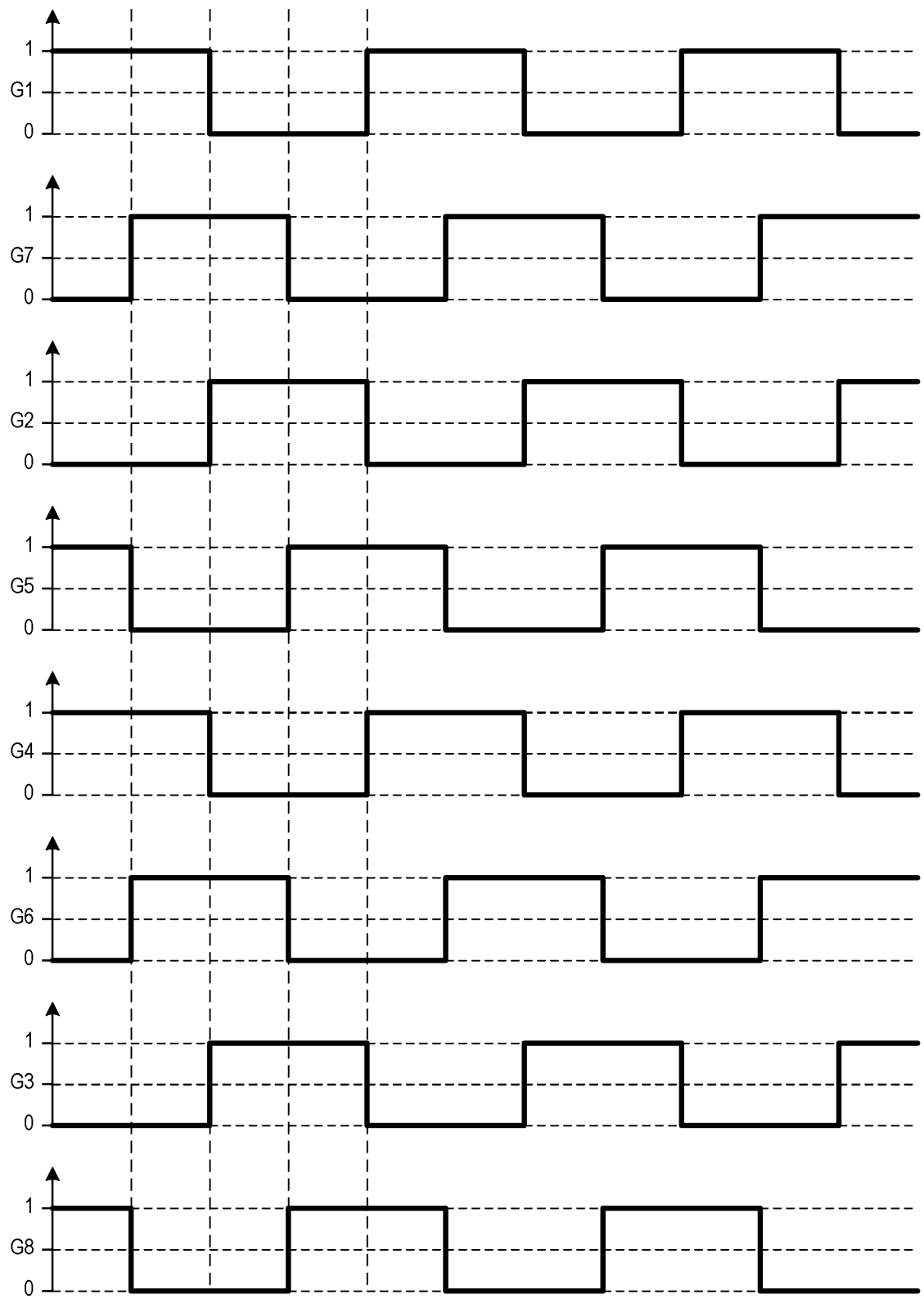
FIG. 13 is a waveform diagram of the amplifier gate drive signals G1, G2, G3, and G4 and of the OLRMC gate drive signals G5, G6, G7, and G8 during inductive load operation.

FIG. 13 is a waveform diagram of the amplifier gate drive signals G1, G2, G3, and G4 and of the OLRMC gate drive signals G5, G6, G7, and G8 during inductive load operation. The OLRMC gate drive signal G5 is phase shifted ninety-degrees)(90°) ahead of the amplifier gate drive signal G1. The OLRMC gate drive signal G6 is phase shifted ninety-degrees)(90°) ahead of the amplifier gate drive signal G2. The OLRMC gate drive signal G7 is phase shifted ninety-degrees)(90°) ahead of the amplifier gate drive signal G3. The OLRMC gate drive signal G8 is phase shifted ninety-degrees)(90°) ahead of the amplifier gate drive signal G4. The OLRMC gate drive signals G5, G6, G7, and G8 are generated without any sensing of load current ILOAD, without any sensing on output conductor 160, and without involving any feedback loop.

Figure 14:
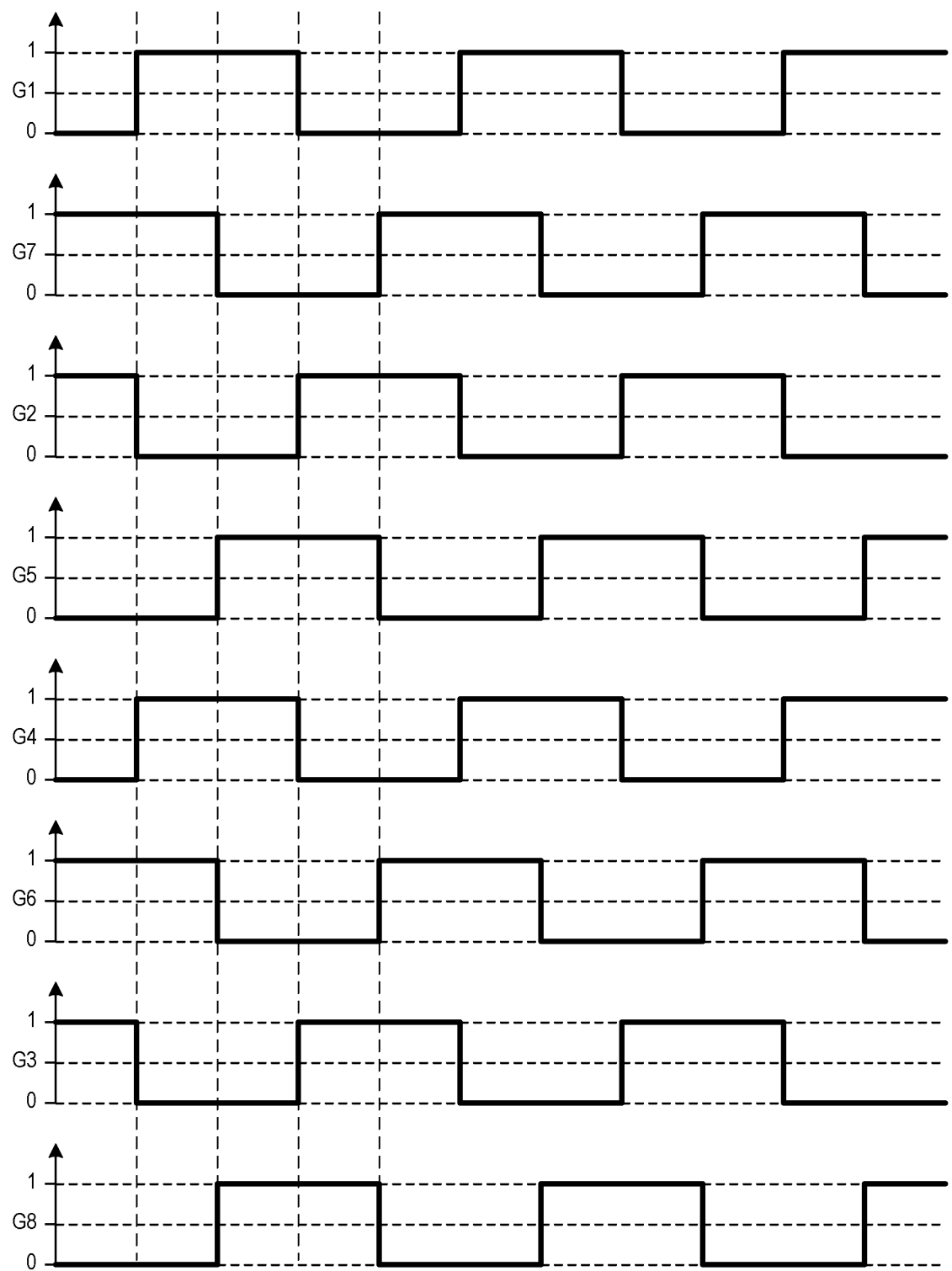
FIG. 14 is a waveform diagram of the amplifier gate drive signals G1, G2, G3, and G4 and of the OLRMC gate drive signals G5, G6, G7, and G8 during capacitive load operation.

FIG. 14 is a waveform diagram of the amplifier gate drive signals G1, G2, G3, and G4 and of the OLRMC gate drive signals G5, G6, G7, and G8 during capacitive load operation. The OLRMC gate drive signal G5 is phase shifted ninety-degrees)(90°) behind the amplifier gate drive signal G1. The OLRMC gate drive signal G6 is phase shifted ninety-degrees)(90°) behind the amplifier gate drive signals G2. The OLRMC gate drive signal G7 is phase shifted ninety-degrees)(90°) behind the amplifier gate drive signals G3. The OLRMC gate drive signal G8 is phase shifted ninety-degrees)(90°) behind the amplifier gate drive signal G4. The OLRMC gate drive signals G5, G6, G7, and G8 are generated without any sensing of load current ILOAD, without any sensing on output conductor 160, and without involving any feedback loop.

Figure 15:
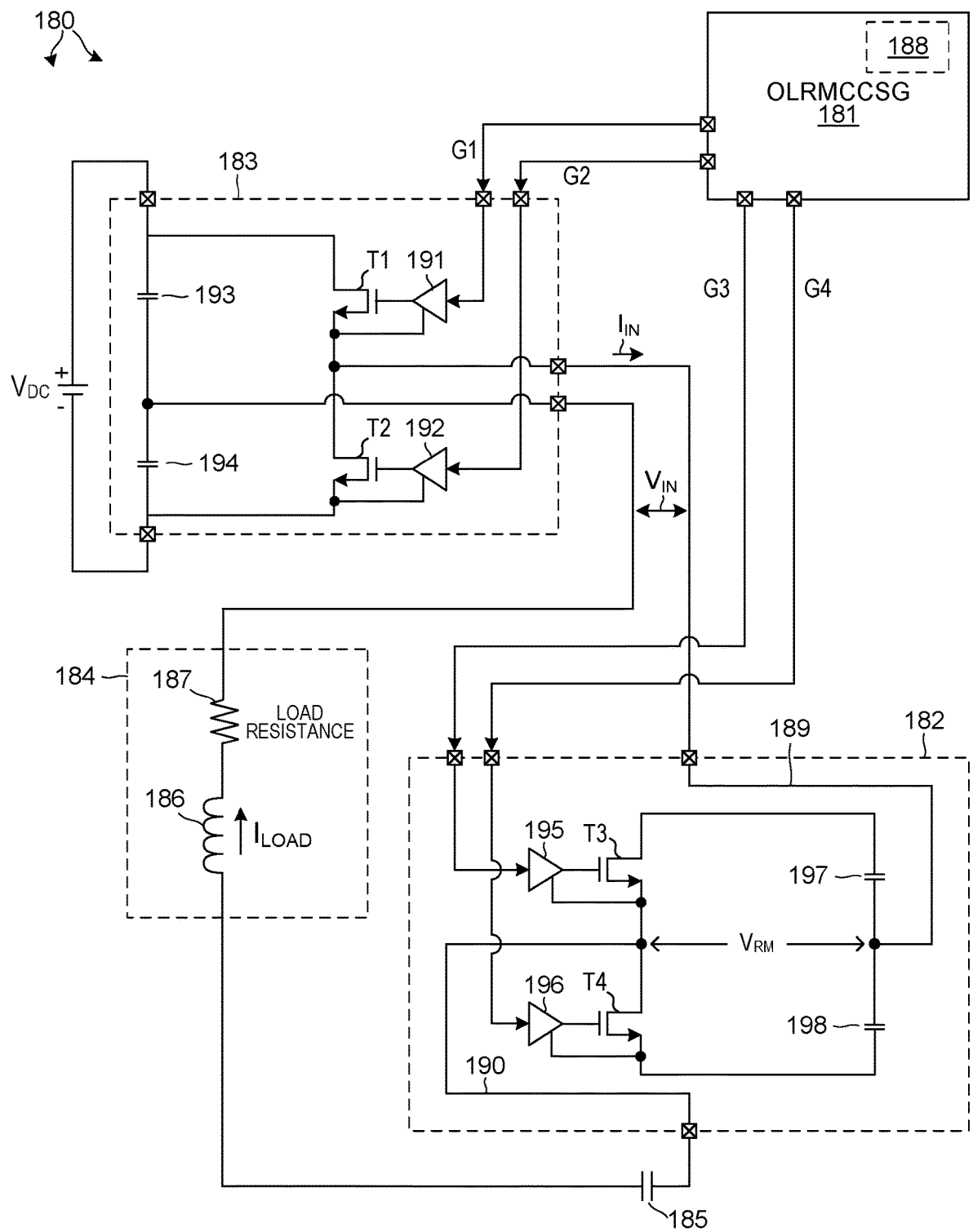
FIG. 15 is a circuit diagram of a circuit 180 having a OLRMCCSG 181 and an OLRMC 182 in a series configuration.

FIG. 15 is a circuit diagram of a circuit 180 having a OLRMCCSG 181 and an OLRMC 182 in a series configuration. The circuit 180 is realized using half-bridge circuit topologies. The circuit 180 comprises voltage source VDC, the OLRMCCSG 181, the OLRMC 182, a power converter 183, a load 184, and a capacitor 185. The load 184 includes an inductor 186 and a load resistance 187. In this example, the power converter is a power amplifier. Power amplifier 183 receives the supply voltage VDC and generates and outputs an input current IIN and an input voltage VIN. The OLRMCCSG 181 generates gate drive signals G1 and G2 that are supplied to and control amplifier 183. The OLRMCCSG 181 has input voltage information 188 from generation of the gate drive signals G1 and G2 which control generation of the input current IIN and the input voltage VIN. The OLRMCCSG 181 generates gate drive signals G3 and G4 that are supplied to and control the OLRMC 182. The OLRMC 182 generates a reactance matching voltage VRM between input conductor 189 and output conductor 190.

The amplifier 183 comprises transistors T1 and T2, gate drive circuits 191 and 192, and capacitors 193 and 194. Gate drive circuit 191 receives the gate drive signal G1 and drives a gate of transistor T1. Gate drive circuit 192 receives the gate drive signal G2 and drives a gate of transistor T2. The OLRMCCSG 181 uses the input voltage information 188 to generate gate drive signals G1 and G2 to generate the desired input current IIN and input voltage VIN supplied to the OLRMC 182.

The OLRMC 182 comprises transistors T3 and T4, gate drive circuits 195, 196, and capacitors 197 and 198. Gate drive circuit 195 receives the gate drive signal G3 and drives a gate of transistor T3. Gate drive circuit 196 receives the gate drive signal G4 and drives a gate of transistor T4. The gate drive signals G3 and G4 cause the OLRMC 152 to generate the reactance matching voltage VRM between input conductor 189 and output conductor 190. The reactance matching voltage VRM causes the input voltage VIN and the input current IIN to be in phase during steady state operation.

The OLRMCCSG 181 generates the gate drive signals G3 and G4 by phase shifting the gate drive signals G1 and G2 by ninety-degrees)(90°). If the load 184 is an inductive type load, then the OLRMCCSG 181 generates the gate drive signals G3 and G4 to be phase shifted ninety-degrees)(90°) ahead of the amplifier gate drive signals G1 and G2. The gate drive signals G3 and G4 lead ahead of the amplifier gate drive signals G1 and G2 by ninety-degrees)(90°). If the load 184 is a capacitive type load, then the OLRMCCSG 181 generates the gate drive signals G3 and G4 to be phase shifted ninety-degrees)(90°) behind the amplifier gate drive signals G1 and G2. The gate drive signals G3 and G4 lag behind the amplifier gate drive signals G1 and G2 by ninety-degrees)(90°).

Figure 16:
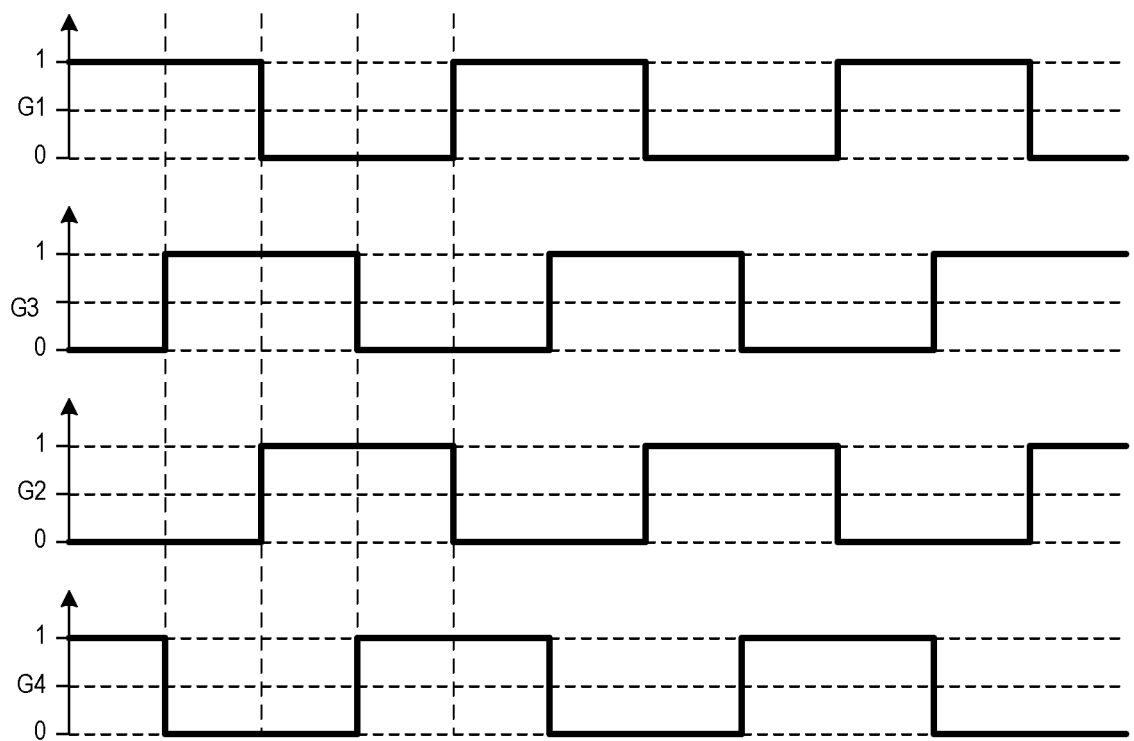
FIG. 16 is a waveform diagram of the amplifier gate drive signals G1 and G2 and of the OLRMC gate drive signals G3 and G4 during inductive load operation.

FIG. 16 is a waveform diagram of the amplifier gate drive signals G1 and G2 and of the OLRMC gate drive signals G3 and G4 during inductive load operation. The OLRMC gate drive signal G3 is phase shifted ninety-degrees)(90°) ahead of the amplifier gate drive signal G1. The OLRMC gate drive signal G4 is phase shifted ninety-degrees) (90°) ahead of the amplifier gate drive signal G2. The OLRMC gate drive signals G3 and G4 are generated without any sensing of load current ILOAD, without any sensing on output conductor 180, and without involving any feedback loop.

Figure 17:
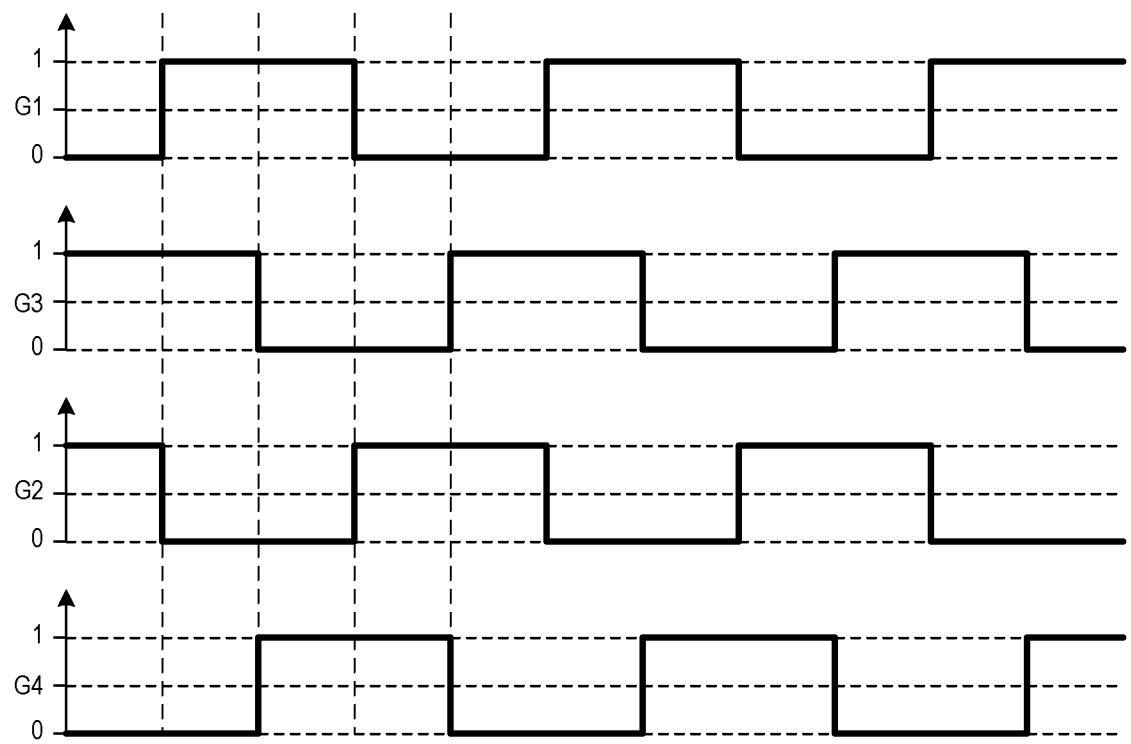
FIG. 17 is a waveform diagram of the amplifier gate drive signals G1 and G2 and of the OLRMC gate drive signals G3 and G4 during capacitive load operation.

FIG. 17 is a waveform diagram of the amplifier gate drive signals G1 and G2 and of the OLRMC gate drive signals G3 and G4 during inductive load operation. The OLRMC gate drive signal G3 is phase shifted ninety-degrees)(90°) behind the amplifier gate drive signal G1. The OLRMC gate drive signal G4 is phase shifted ninety-degrees) (90°) behind the amplifier gate drive signal G2. The OLRMC gate drive signals G3 and G4 are generated without any sensing of load current ILOAD, without any sensing on output conductor 180, and without involving any feedback loop.

Figure 18:
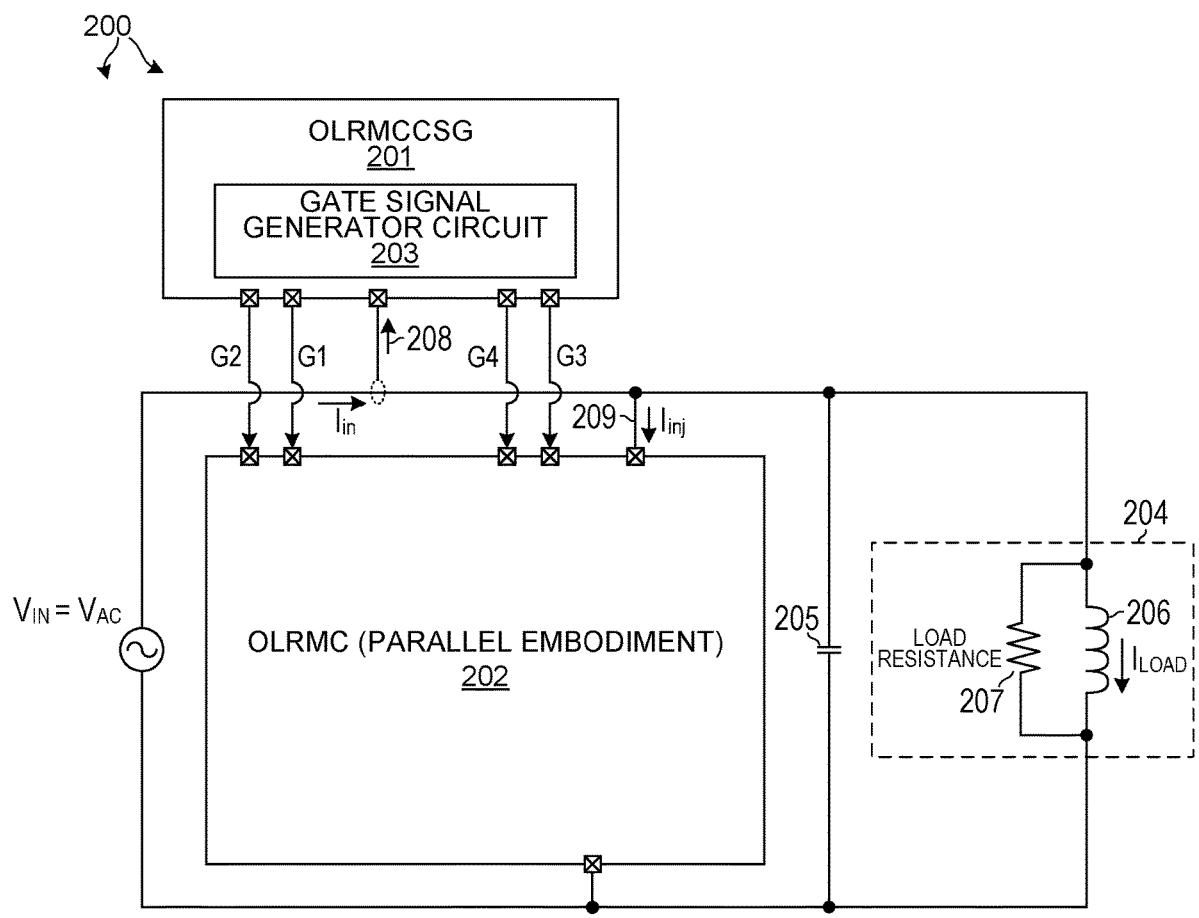
FIG. 18 is a circuit diagram of a circuit 200 having a OLRMCCSG 201 and an OLRMC 202 in a parallel configuration with respect to load.

FIG. 18 is a circuit diagram of a circuit 200 having a OLRMCCSG 201 and an OLRMC 202 in a parallel configuration with respect to load. The circuit 200 is realized using a full-bridge circuit topology. The circuit 200 comprises voltage source VAC, the
OLRMCCSG 201, the OLRMC 202, a load 204, and a capacitor 205. The OLRMCCSG 201 includes gate signal generator circuit 203. The load 204 includes an inductor 206 and a load resistance 207. The OLRMCCSG 201 generates gate drive signals G1, G2, G3, and G4 that are supplied to and control OLRMC 202. The OLRMCCSG 201 has input current information 208. In this example, the input current information 208 involves directly or indirectly sensing the input current IIN. The OLRMCCSG 201 generates gate drive signals G1, G2, G3, and G4 using the input current information 208. Control of the OLRMC 202 causes a reactance matching current IRM to be supplied to the OLRMC 202 via a reactance matching current conductor 209.

Figure 19:
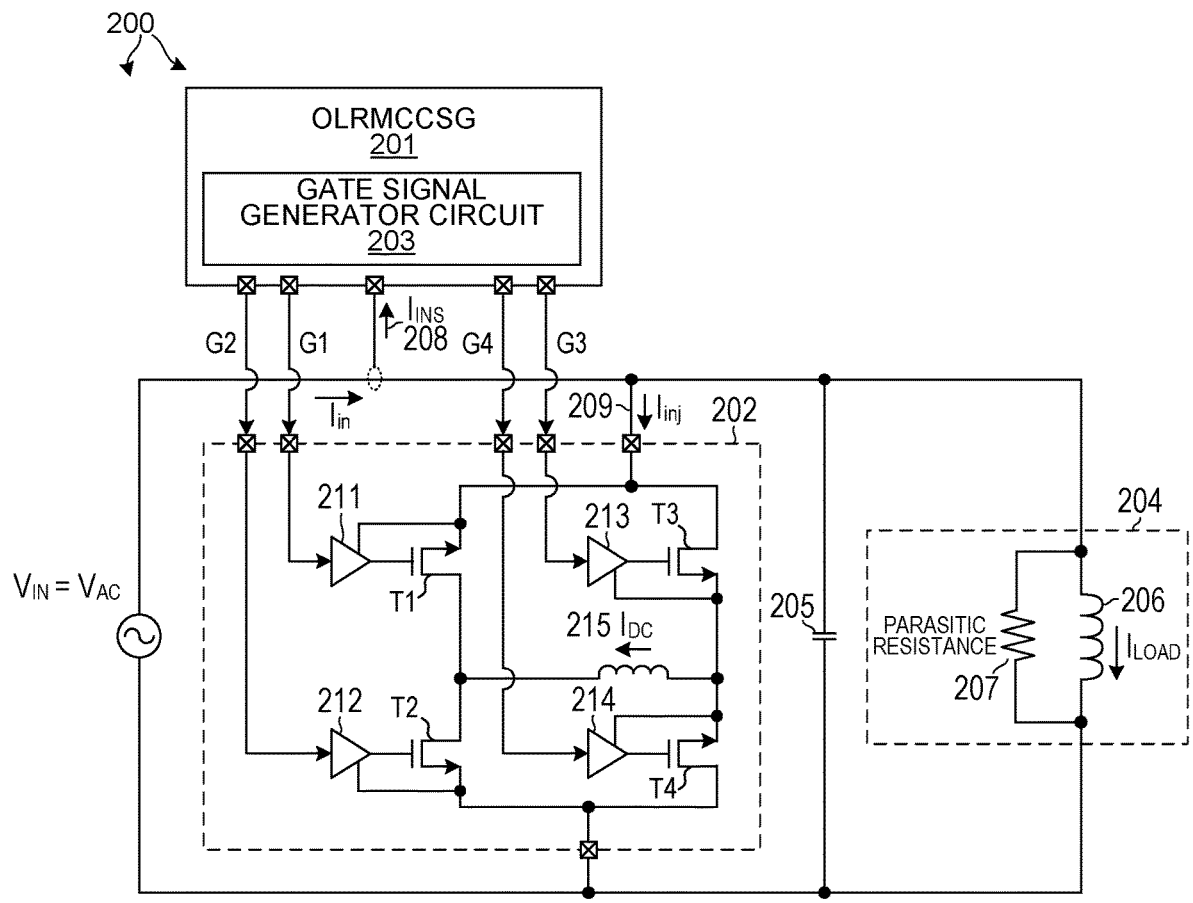
FIG. 19 is a more detailed circuit diagram of the circuit 200 shown in FIG. 18.

FIG. 19 is a more detailed circuit diagram of the circuit 200 shown in FIG. 18. The OLRMC 202 comprises transistors T1, T2, T3, and T4, gate drive circuits 211, 212, and 213, and 214, and an inductor 215. Gate drive circuit 211 receives the gate drive signal G1 and drives a gate of transistor T1. Gate drive circuit 212 receives the gate drive signal G2 and drives a gate of transistor T2. Gate drive circuit 213 receives the gate drive signal G3 and drives a gate of transistor T3. Gate drive circuit 214 receives the gate drive signal G4 and drives a gate of transistor T4. The gate signal generator circuit 203 of the OLRMCCSG 201 uses the input current information 208 to generate gate drive signals G1, G2, G3, and G4. The gate drive signals G1, G2, G3, and G4 are supplied to the OLRMC 202 which in turn generates the reactance matching current IRM. The reactance matching current IRM causes the input voltage VIN and the input current IIN to be in phase during steady state operation.

Figure 20:
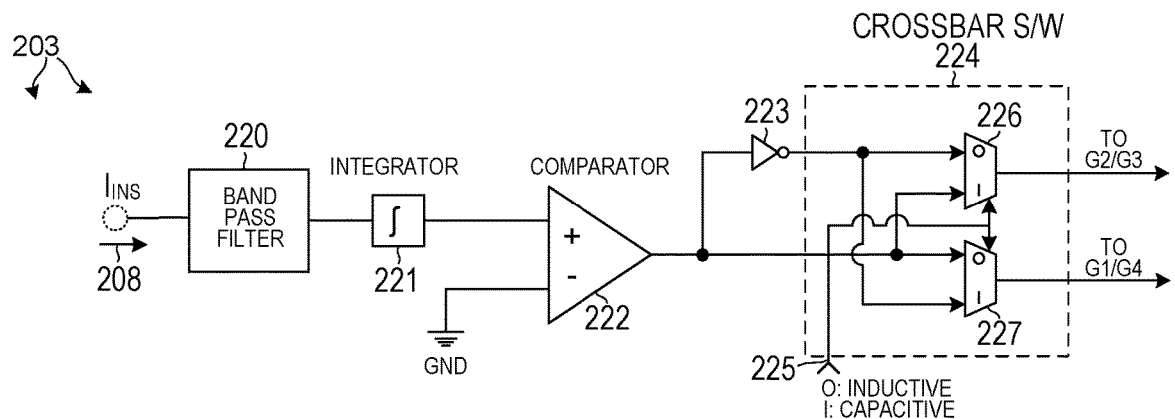
FIG. 20 is a detailed block diagram of the gate signal generator circuit 203.

FIG. 20 is a detailed block diagram of the gate signal generator circuit 203. The gate signal generator circuit 203 generates the gate drive signals G1, G2, G3, and G4 from the input current information 208. The gate signal generator circuit 203 comprises a band pass filter 220, an integrator 221, a comparator 222, a NOT gate 223, and a crossbar switch 224. The crossbar 224 includes a select input bit 225 indicating whether the load 204 is an inductive type load or a capacitive type load. The crossbar 224 includes a first 2-to-1 multiplexer 226 and a second multiplexer 227. During inductive load operation, the select input bit 225 selects the output of the NOT gate 223 to supply gating signals G2 and G3 onto transistors T2 and T3, respectively, and the output of comparator 222 to supply gating signals G1 and G4 onto transistors T1 and T4, respectively. During capacitive load operation, the select input bit 225 selects the output of the NOT gate 223 to supply gating signals G1 and G4 onto transistors T1 and T4, respectively, and the output of comparator 222 to supply gating signals G2 and G3 onto transistors T2 and T3, respectively.

During operation, the gate signal generator circuit 203 generates square wave signals that are phase shifted with respect to the input current IIN. When the load 204 is an inductive type load, the gate signal generator circuit 203 generates square wave signals that are ninety-degrees)(90°) phase shifted behind the input current IIN. When the load 204 is a capacitive type load, the gate signal generator circuit 203 generates square wave signals that are ninety-degrees) (90°) phase shifted ahead of the input current IIN.

Figure 21:
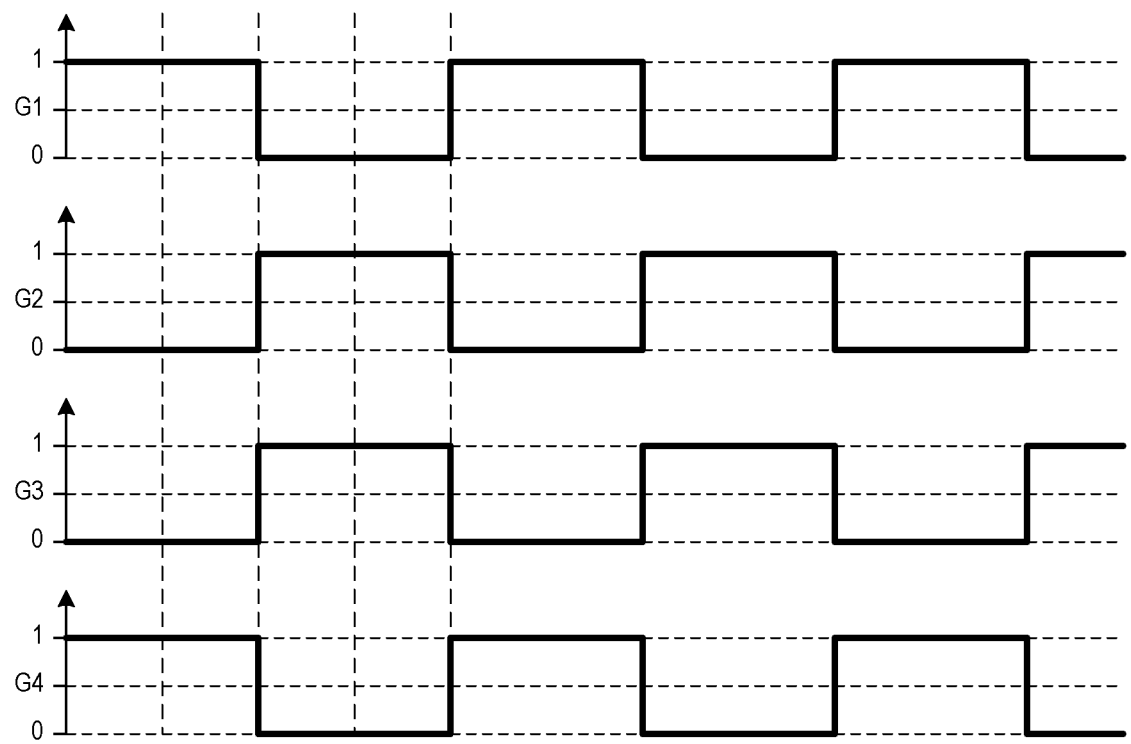
FIG. 21 is a waveform diagram of the amplifier gate drive signals G1, G2, G3, and G4 during inductive load operation.

FIG. 21 is a waveform diagram of the gate drive signals G1, G2, G3, and G4 during inductive load operation. In this example, select input bit 225 has a digital logic low level indicating that the load is an inductive type load. The OLRMC gate drive signals G1, G2, G3, and G4 are generated without any sensing of load current ILOAD and without involving any feedback loop.

Figure 22:
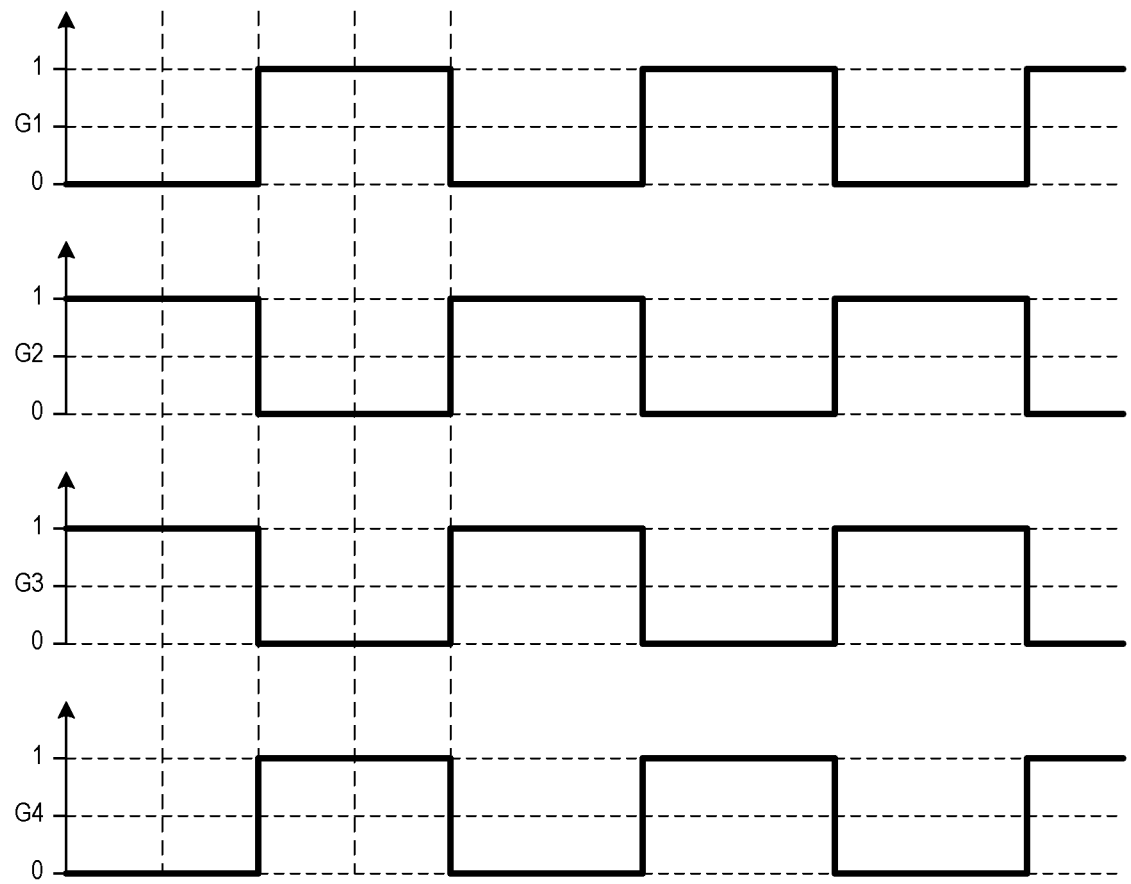
FIG. 22 is a waveform diagram of the amplifier gate drive signals G1, G2, G3, and G4 during capacitive load operation.

FIG. 22 is a waveform diagram of the gate drive signals G1, G2, G3, and G4 during capacitive load operation. In this example, select input bit 225 has a digital logic high level indicating that the load is a capacitive type load. The OLRMC gate drive signals G1, G2, G3, and G4 are generated without any sensing of load current ILOAD and without involving any feedback loop.

Figure 23:
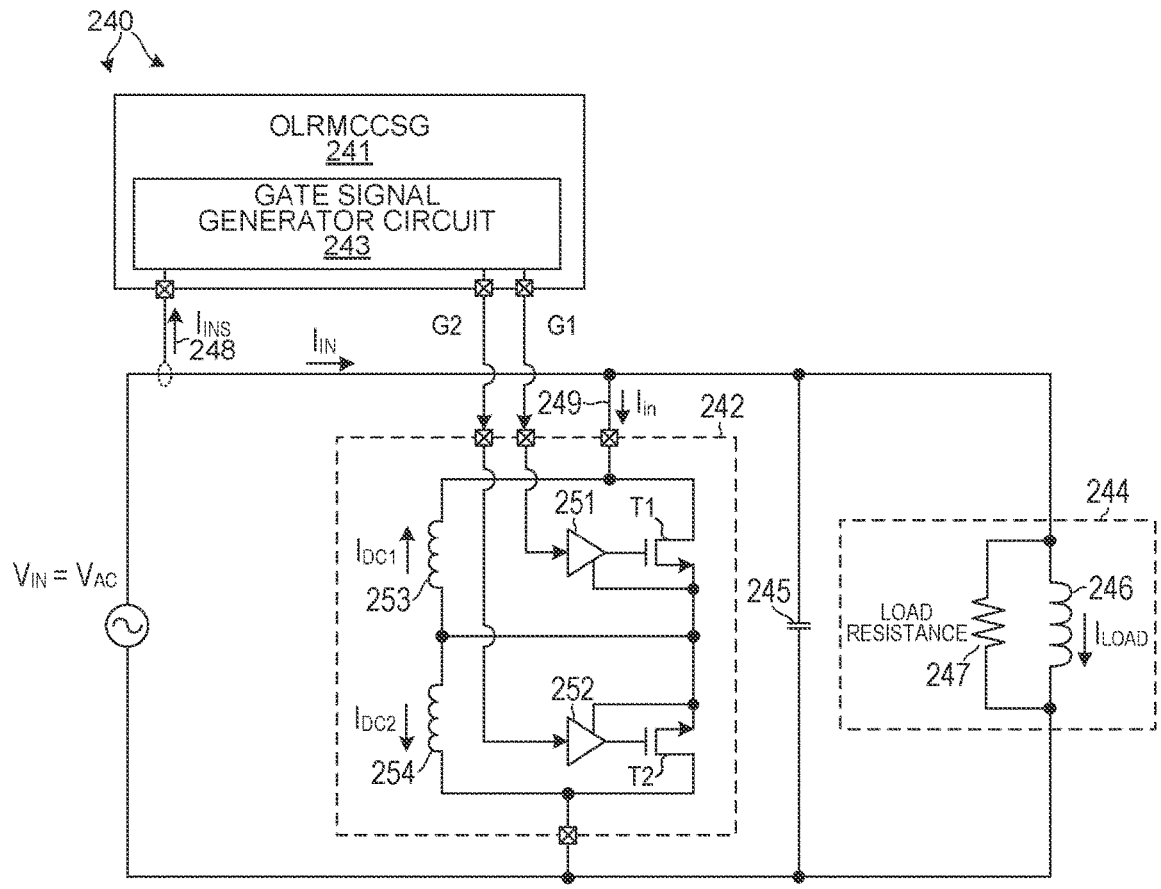
FIG. 23 is a circuit diagram of a circuit 240 having a OLRMCCSG 241 and an OLRMC 242 in a parallel configuration with respect to load.

FIG. 23 is a circuit diagram of a circuit 240 having a OLRMCCSG 241 and an OLRMC 242 in a parallel configuration with respect to load. The circuit 240 is realized using a half-bridge circuit topology. The circuit 240 comprises voltage source VAC, the OLRMCCSG 241, the OLRMC 242, a load 244, and a capacitor 245. The OLRMCCSG 241 includes gate signal generator circuit 243. The load 244 includes an inductor 246 and a load resistance 247. The OLRMCCSG 241 generates gate drive signals G1 and G2 that are supplied to and control OLRMC 242. The OLRMCCSG 241 has input current information 248. In this example, the input current information 248 involves directly or indirectly sensing the input current IIN. The OLRMCCSG 241 generates gate drive signals G1 and G2 using the input current information 248. Control of the OLRMC 242 causes a reactance matching current IRM to be supplied to the OLRMC 242 via a reactance matching current conductor 249.

The OLRMC 242 comprises transistors T1 and T2, gate drive circuits 251 and 252, and inductors 253 and 254. Gate drive circuit 251 receives the gate drive signal G1 and drives a gate of transistor T1. Gate drive circuit 252 receives the gate drive signal G2 and drives a gate of transistor T2. The gate signal generator circuit 243 of the OLRMCCSG 241 uses the input current information 248 to generate gate drive signals G1 and G2. The gate drive signals G1 and G2 are supplied to the OLRMC 242 which in turn generates the reactance matching current IRM. The reactance matching current IRM causes the input voltage VIN and the input current IIN to be in phase during steady state operation.

Figure 24:
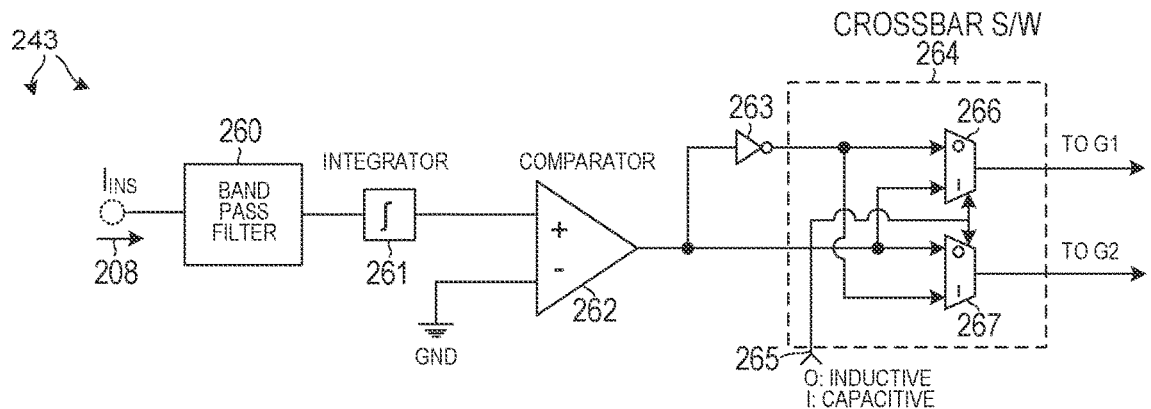
FIG. 24 is a detailed block diagram of the gate signal generator circuit 243.

FIG. 24 is a detailed block diagram of the gate signal generator circuit 243. The gate signal generator circuit 243 generates the gate drive signals G1 and G2 from the input current information 248. The gate signal generator circuit 243 comprises a band pass filter 260, an integrator 261, a comparator 262, a NOT gate 263, and a crossbar switch 264. The crossbar 264 includes a select input bit 265 indicating whether the load 244 is an inductive type load or a capacitive type load. The crossbar 264 includes a first 2-to-1 multiplexer 266 and a second multiplexer 267. During inductive load operation, the select input bit 265 selects the output of the NOT gate 263 to supply gating signal G1 onto transistor T1 and the output of comparator 262 to supply gating signal G2 onto transistor T2. During capacitive load operation, the select input bit 265 selects the output of the NOT gate 263 to supply gating signal G2 onto transistor T2 and the output of comparator 262 to supply gating signal G1 onto transistor T1.

During operation, the gate signal generator circuit 243 generates square wave signals that are phase shifted with respect to the input current IIN. When the load 244 is an inductive type load, the gate signal generator circuit 243 generates square wave signals that are ninety-degrees)(90°) phase shifted behind the input current IIN. When the load 244 is an inductive type load, the gate signal generator circuit 243 generates square wave signals that are ninety-degrees)(90°) phase shifted ahead of the input current IIN.

Figure 25:
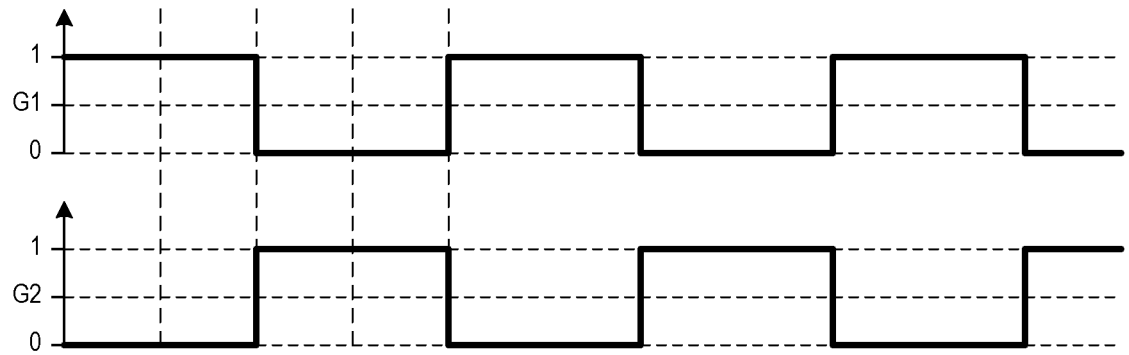
FIG. 25 is a waveform diagram of the gate drive signals G1 and G2 during inductive load operation.

FIG. 25 is a waveform diagram of the gate drive signals G1 and G2 during inductive load operation. In this example, select input bit 265 has a digital logic low level indicating that the load is an inductive type load. The OLRMC gate drive signals G1 and G2 are generated without any sensing of load current ILOAD and without involving any feedback loop.

Figure 26:
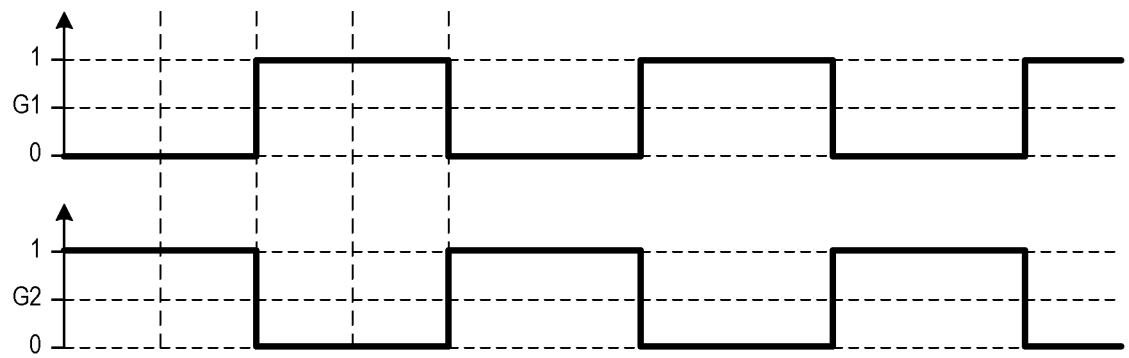
FIG. 26 is a waveform diagram of the gate drive signals G1 and G2 during capacitive load operation.

FIG. 26 is a waveform diagram of the gate drive signals G1 and G2 during capacitive load operation. In this example, select input bit 265 has a digital logic high level indicating that the load is a capacitive type load. The OLRMC gate drive signals G1 and G2 are generated without any sensing of load current ILOAD and without involving any feedback loop.

Figure 27:
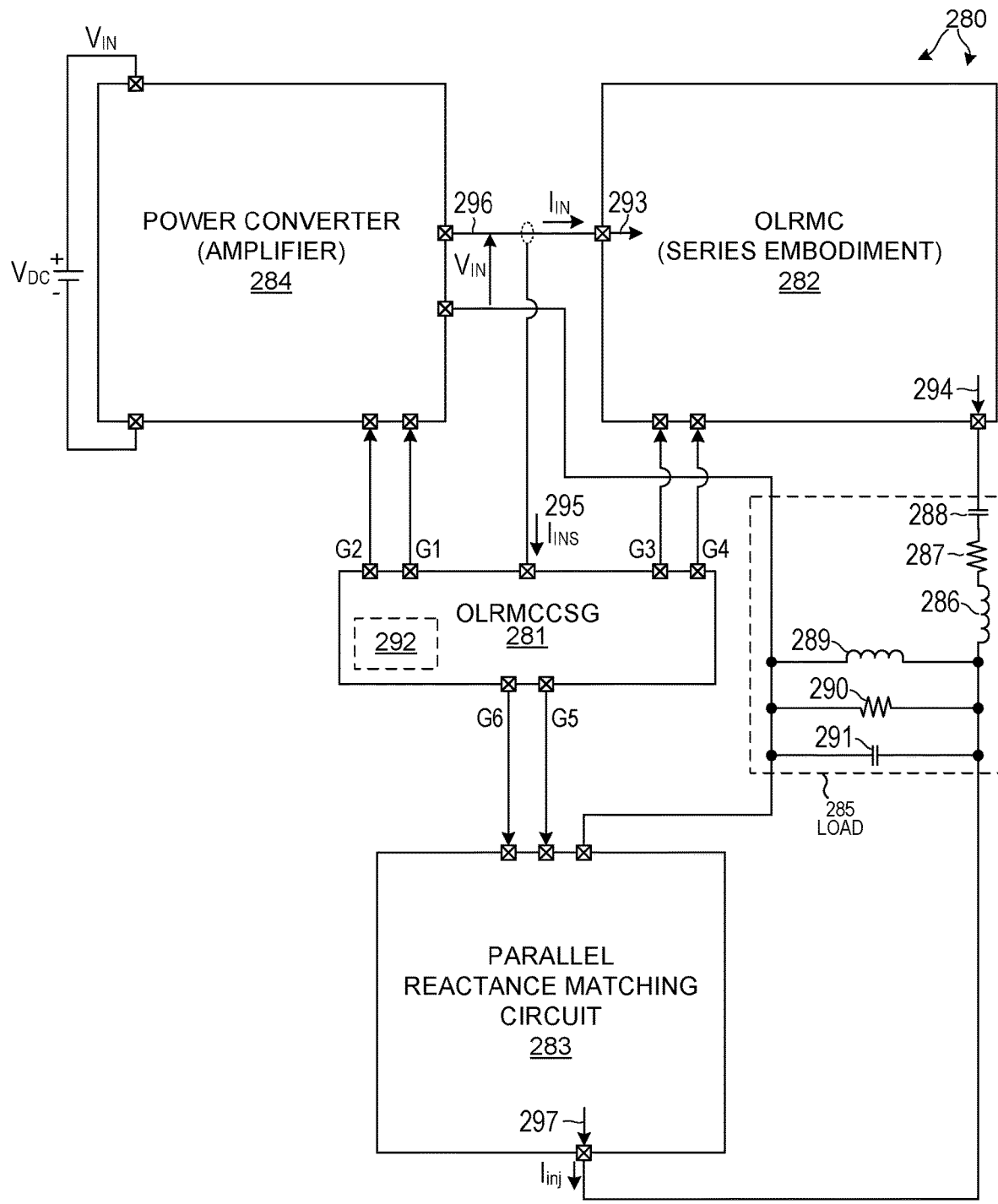
FIG. 27 is a circuit diagram of a circuit 280 having an OLRMCCSG 281, a first OLRMC 282 in a series configuration, and a second OLRMC 283 in a parallel configuration.

FIG. 27 is a circuit diagram of a circuit 280 having a OLRMCCSG 281, a first OLRMC 282 in a series configuration, and a second OLRMC 283 in a parallel configuration. The circuit 280 is realized using half-bridge circuit topologies. The circuit 280 comprises voltage source VDC, a power converter 284, and a load 285. The first OLRMC 282 is coupled in series with respect to the load 285. The second OLRMC 283 is coupled in parallel with respect to the load 285. The load 285 includes a first inductor 286, a first load resistance 287, a first capacitor 288, a second inductor 289, a second load resistance 290, and a second capacitor 291. In this example, the power converter 284 is a power amplifier. Power amplifier 284 receives the supply voltage VDC and generates and outputs an input current IIN and an input voltage VIN. The OLRMCCSG 281 generates gate drive signals G1, G2, G3, G4, G5, and G6. The OLRMCCSG 281 supplies gate drive signals G1 and G2 onto the amplifier 284. The OLRMCCSG 281 supplies gate drive signals G3 and G4 onto the first OLRMC 282. The OLRMCCSG 281 supplies gate drive signals G5 and G6 onto the second OLRMC 283.

The OLRMCCSG 281 has input voltage information 292 from generation of the gate drive signals G1 and G2 which control the amplifier 284 in generating the input current IIN and the input voltage VIN. The first OLRMC 282 generates a reactance matching voltage VRM between input conductor 293 and output conductor 294. The OLRMCCSG 281 receives input current information 295. In this example, the input current information 296 is obtained by directly or indirectly sensing a current on conductor 296. The second OLRMC 283 generates a reactance matching current IRM on the reactance matching current conductor 297.

Figure 28:
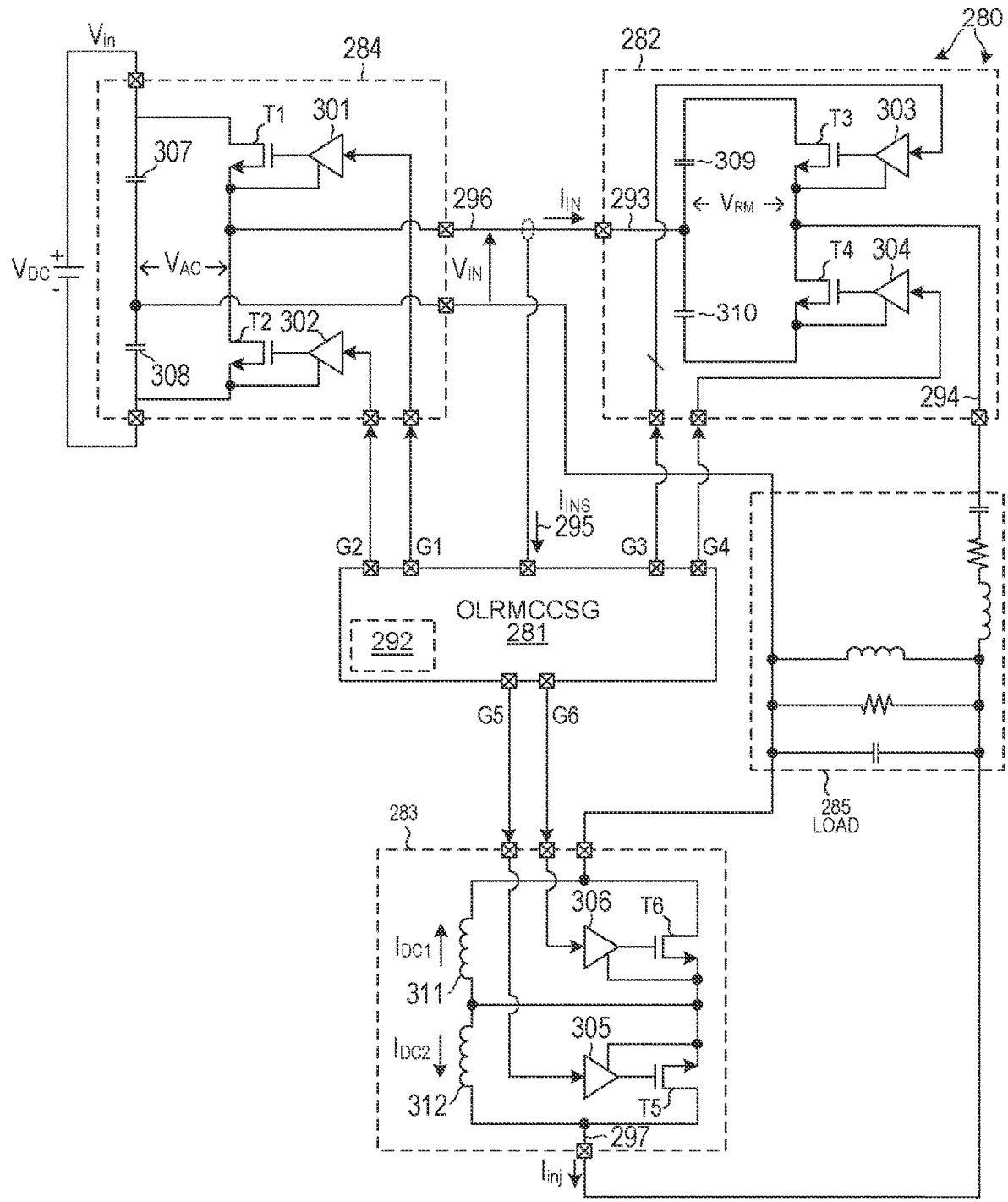
FIG. 28 is a more detailed circuit diagram of the circuit 280.

FIG. 28 is a more detailed circuit diagram of the circuit 280. The amplifier 284 comprises transistors T1 and T2, gate drive circuits 301 and 302, and capacitors 307 and 308. Gate drive circuit 301 receives the gate drive signal G1 and drives a gate of transistor T1. Gate drive circuit 302 receives the gate drive signal G2 and drives a gate of transistor T2. The OLRMCCSG 281 uses the input voltage information 292 to generate gate drive signals G1 and G2 to generate the desired input current IIN and input voltage VIN supplied to the first OLRMC 282.

The first OLRMC 282 comprises transistors T3 and T4, gate drive circuits 303 and 304, and capacitors 309 and 310. Gate drive circuit 303 receives the gate drive signal G3 and drives a gate of transistor T3. Gate drive circuit 304 receives the gate drive signal G4 and drives a gate of transistor T4. The gate drive signals G3 and G4 cause the first OLRMC 282 to generate the reactance matching voltage VRM between input conductor 293 and output conductor 294. The reactance matching voltage VRM causes the input voltage VIN and the input current IIN to be in phase during steady state operation.

The second OLRMC 283 comprises transistors T5 and T6, gate drive circuits 305 and 306, and inductors 311 and 312. Gate drive circuit 305 receives the gate drive signal G5 and drives a gate of transistor T5. Gate drive circuit 306 receives the gate drive signal G6 and drives a gate of transistor T6. The gate signal generator circuit of the OLRMCCSG 281 uses the input current information 295 to generate gate drive signals G5 and G6. The gate drive signals G5 and G6 are supplied to the second OLRMC 283 which in turn generates the reactance matching current IRM. The reactance matching current IRM causes the input voltage VIN and the input current IIN to be in phase during steady state operation.

Figure 29:
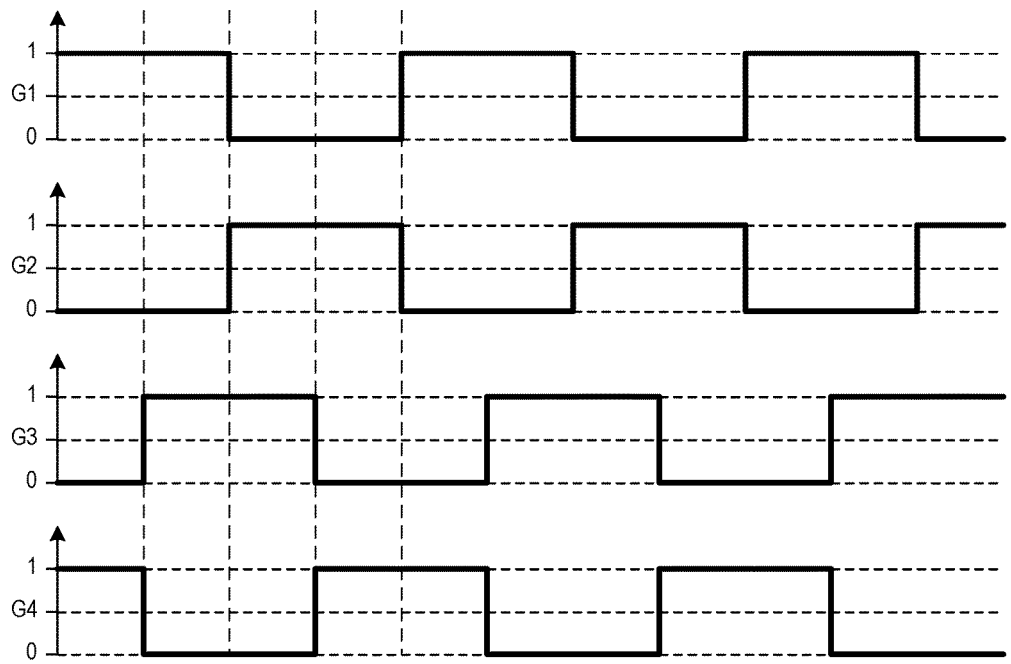
FIG. 29 is a waveform diagram of the amplifier gate drive signals G1 and G2 and of the first OLRMC gate drive signals G3 and G4 during operation of the circuit 280.

FIG. 29 is a waveform diagram of the amplifier gate drive signals G1 and G2 and of the first OLRMC gate drive signals G3 and G4 during operation of the circuit 280. The OLRMC gate drive signal G3 is phase shifted ninety-degrees)(90°) behind the amplifier gate drive signal G1. The OLRMC gate drive signal G4 is phase shifted ninety-degrees)(90°) behind the amplifier gate drive signal G2. The OLRMC gate drive signals G3 and G4 are generated without any sensing on the load and without involving any feedback loop.

Figure 30:
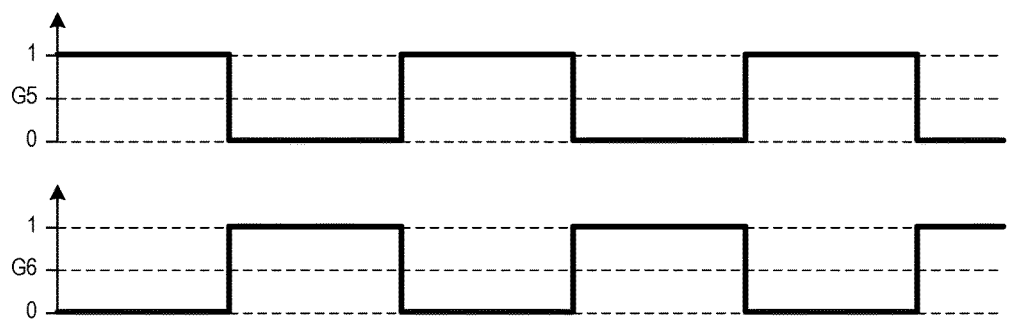
FIG. 30 is a waveform diagram of the second OLRMC gate drive signals G5 and G6 during operation of the circuit 280.

FIG. 30 is a waveform diagram of the second OLRMC gate drive signals G5 and G6 during operation of the circuit 280. The OLRMC gate drive signal G5 is phase shifted ninety-degrees)(90°) ahead of the input current IIN. The OLRMC gate drive signal G6 is phase shifted ninety-degrees)(90°) ahead of the input current IIN. The OLRMC gate drive signals G5 and G6 are generated without any sensing on the load and without involving any feedback loop. In this example, the gate drive signals G5 and G6 are generated using the gate signal generator circuit 203 shown in FIG. 24.

Figure 31:
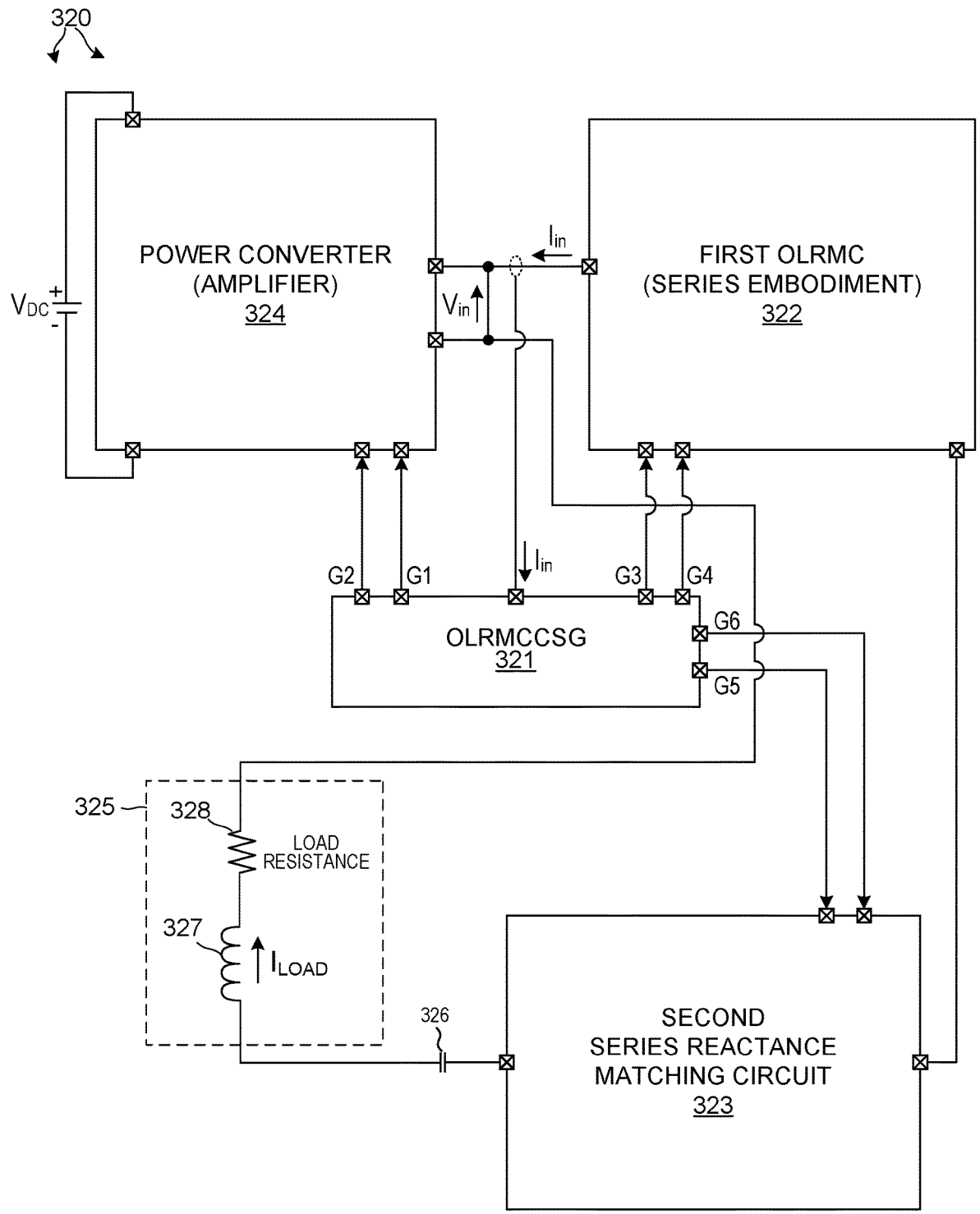
FIG. 31 is a circuit diagram of a circuit 320 having two OLRMC circuits in a series configuration.

FIG. 31 is a circuit diagram of a circuit 320 having two OLRMC circuits in a series configuration. The circuit 320 is realized using half-bridge circuit topologies. The circuit 320 comprises a voltage source VDC, OLRMCCSG 321, a first OLRMC circuit 322, a second OLRMC circuit 323, a power converter 324, a load 325, and a capacitor 326. The first OLRMC 322 and second OLRMC 323 are coupled in series with respect to the load 325. The load 325 includes an inductor 327 and a load resistance 328. In this example, the power converter 324 is a power amplifier. Power amplifier 324 receives the supply voltage VDC and generates and outputs an input current IIN and an input voltage VIN. The OLRMCCSG 321 generates gate drive signals G1, G2, G3, G4, G5, and G6. The OLRMCCSG 321 supplies gate drive signals G1 and G2 onto the amplifier 324. The OLRMCCSG 321 supplies gate drive signals G3 and G4 onto the first OLRMC 322. The OLRMCCSG 321 supplies gate drive signals G5 and G6 onto the second OLRMC 323.

Figure 32:
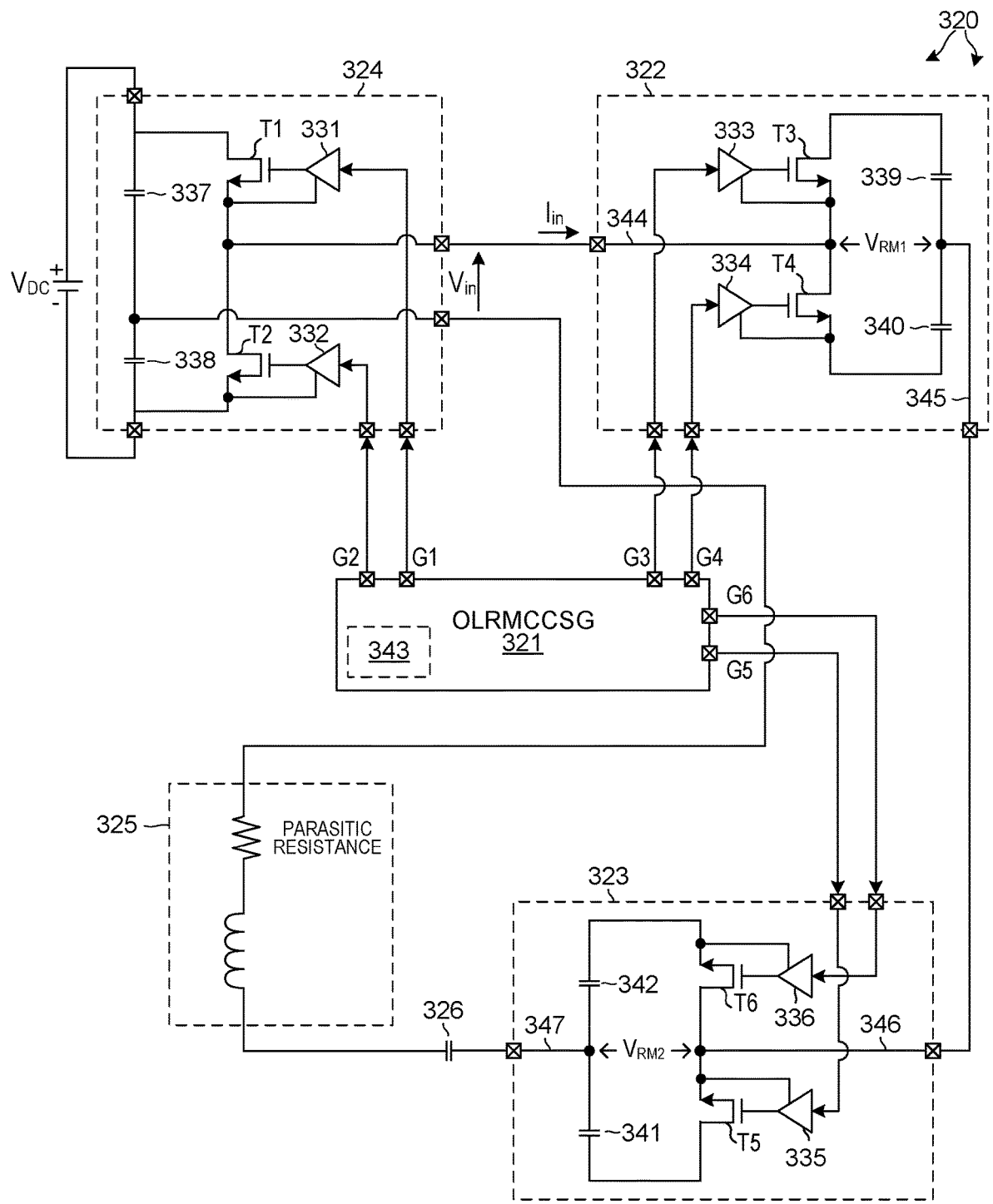
FIG. 32 is a more detailed circuit diagram of the circuit 320.

FIG. 32 is a more detailed circuit diagram of the circuit 320. The amplifier 324 comprises transistors T1 and T2, gate drive circuits 331 and 332, and capacitors 337 and 338. Gate drive circuit 331 receives the gate drive signal G1 and drives a gate of transistor T1. Gate drive circuit 332 receives the gate drive signal G2 and drives a gate of transistor T2. The OLRMCCSG 321 uses the input voltage information 343 to generate gate drive signals G1 and G2 to generate the desired input current IIN and input voltage VIN supplied to the first OLRMC 322.

The first OLRMC 322 comprises transistors T3 and T4, gate drive circuits 333 and 334, and capacitors 339 and 340. Gate drive circuit 333 receives the gate drive signal G3 and drives a gate of transistor T3. Gate drive circuit 334 receives the gate drive signal G4 and drives a gate of transistor T4. The gate drive signals G3 and G4 cause the first OLRMC 322 to generate a first reactance matching voltage VRM1 between input conductor 344 and output conductor 345.

The second OLRMC 323 comprises transistors T5 and T6, gate drive circuits 335 and 336, and capacitors 341 and 342. Gate drive circuit 335 receives the gate drive signal G5 and drives a gate of transistor T5. Gate drive circuit 336 receives the gate drive signal G6 and drives a gate of transistor T6. The gate drive signals G5 and G6 cause the second OLRMC 322 to generate a second reactance matching voltage VRM2 between input conductor 346 and output conductor 347. The input conductor 346 is directly coupled to the output conductor 345 of the first OLRMC 322.

Figure 33:
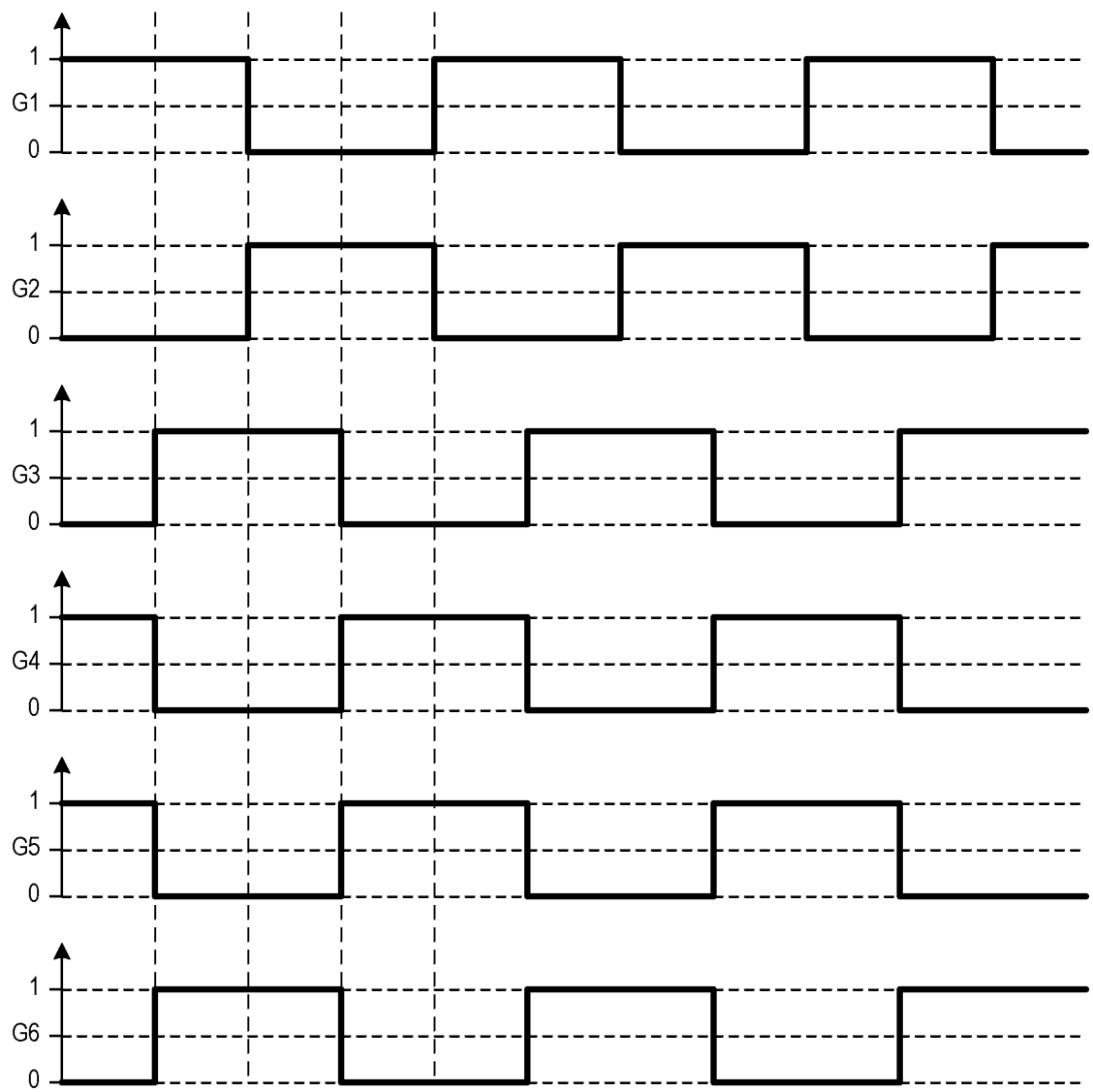
FIG. 33 is a waveform diagram of the gate drive signals G1, G2, G3, G4, G5, and G6 during steady state operation of circuit 320.

FIG. 33 is a waveform diagram of the gate drive signals G1, G2, G3, G4, G5, and G6 during steady state operation of circuit 320. The circuit 320 drives either capacitive or inductive loads without any re-configuration or alteration of how the gate drive signals G3, G4, G5 and G6 are generated. The first OLRMC 322 is controlled assuming load 325 is an inductive load and the second OLRMC 323 is controlled assuming load 325 is a capacitive load. The gate drive signals G3 and G4 supplied to the first OLRMC 322 are phase shifted ninety-degrees)(90°) behind the amplifier gate drive signals G1 and G2. The gate drive signals G5 and G6 supplied to the second OLRMC 323 are phase shifted ninety-degrees)(90°) ahead of the amplifier gate drive signals G1 and G2. The OLRMC gate drive signals G3, G4, G5, and G6 are generated without any sensing on the load and without involving any feedback loop.

Figure 34:
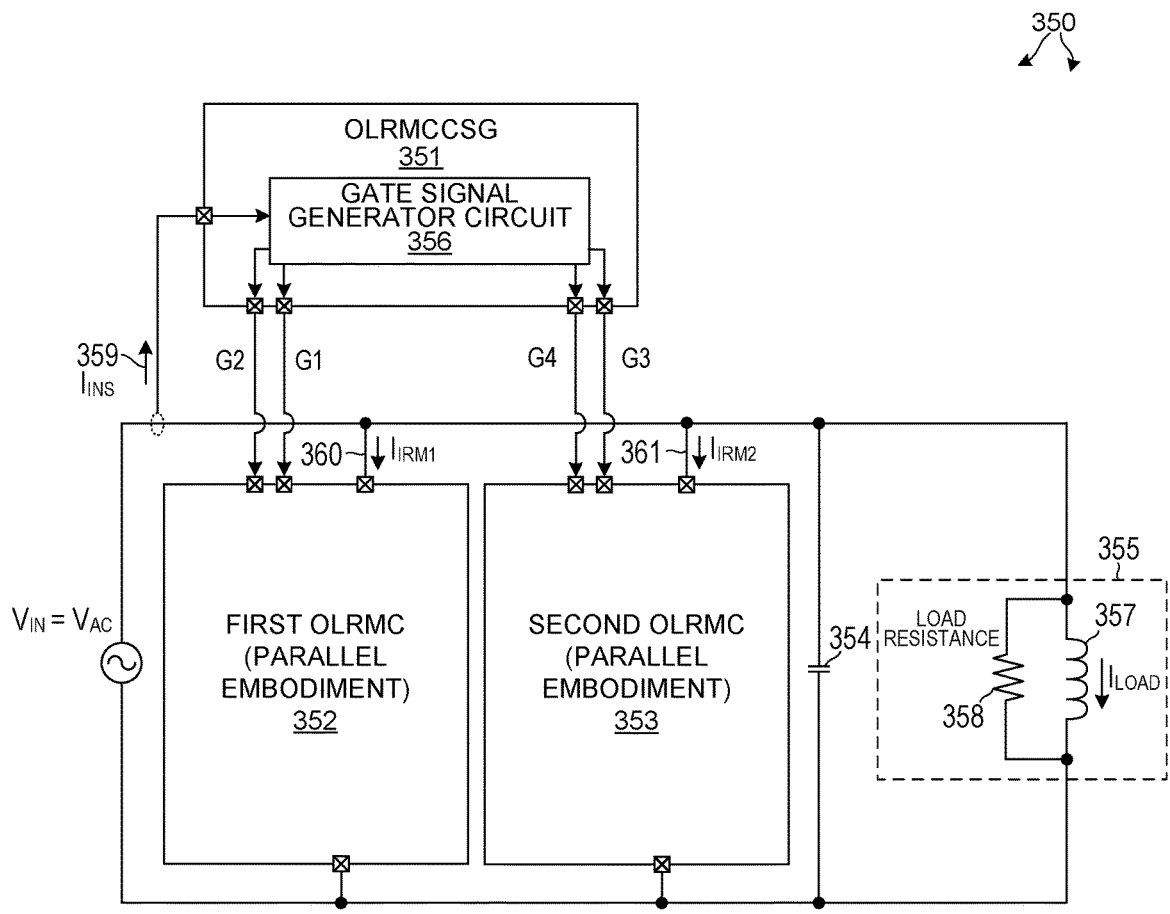
FIG. 34 is a circuit diagram of a circuit 350 having two OLRMC circuits in a parallel configuration.

FIG. 34 is a circuit diagram of a circuit 350 having two OLRMC circuits in a parallel configuration. The circuit 350 is realized using half-bridge circuit topologies. The circuit 350 comprises a voltage source VAC, OLRMCCSG 351, a first OLRMC circuit 352, a second OLRMC circuit 353, a capacitor 354, and a load 355. The first OLRMC 352 and second OLRMC 353 are coupled in parallel with respect to the load 355. The load 355 includes an inductor 357 and a load resistance 358.

The OLRMCCSG 351 includes a gate signal generator circuit 356. The gate signal generator circuit 356 receives current input information 359 and generates gate drive signals G1, G2, G3, and G4. In this example, the input current information 359 is a current sense signal TINS obtained by sensing the input current IIN. The input current information 359 may be obtained by directly or indirectly the input current TIN or by receiving an external digital signal storing this information.

The OLRMCCSG 351 controls the first OLRMC 352 and the second OLRMC 353 to generate reactance matching currents IRM1 and IRM2. The first reactance matching current IRM1 is supplied on a first reactance matching current conductor 360. The second reactance matching current IRM2 is supplied on a second reactance matching current conductor 361. The first reactance matching current IRM1 is generated assuming the load 355 is a capacitive type load. The second reactance matching current IRM2 is generated assuming the load 355 is an inductive type load.

Figure 35:
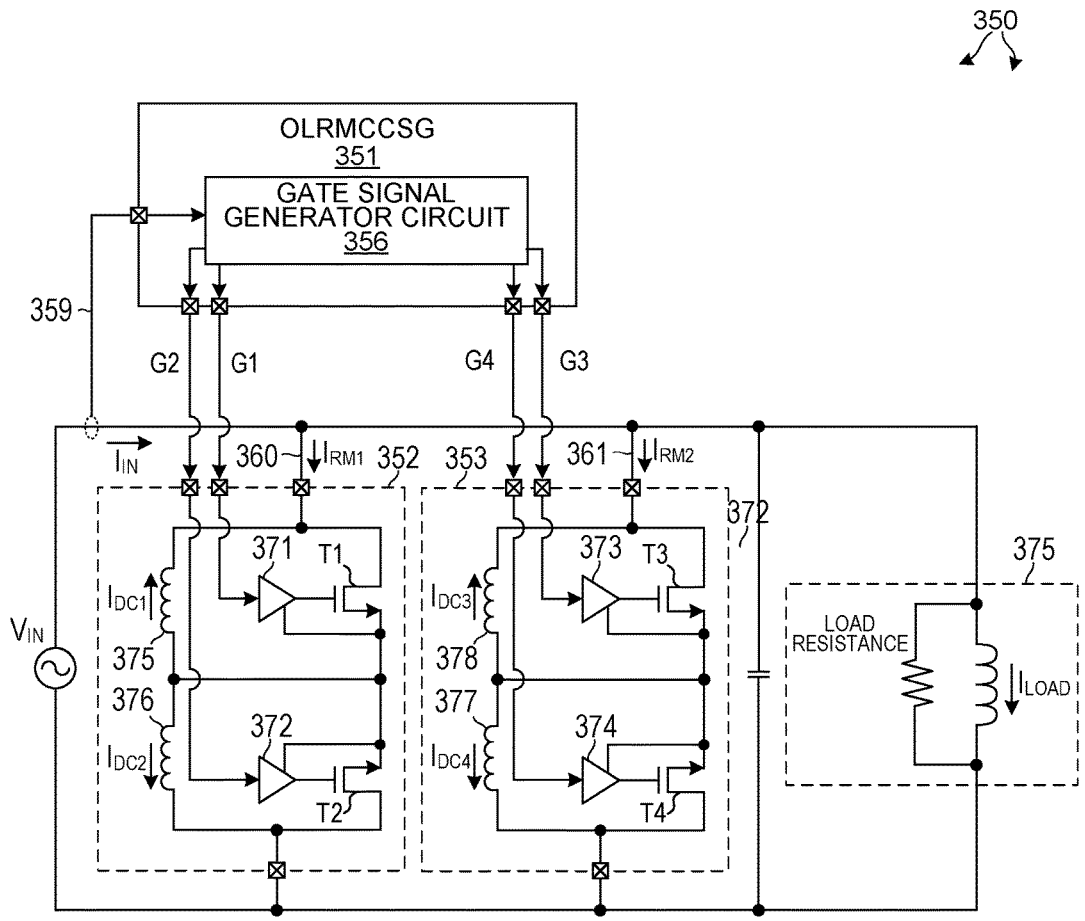
FIG. 35 is a more detailed circuit diagram of the circuit 350.

FIG. 35 is a more detailed circuit diagram of the circuit 350. The first OLRMC 352 comprises transistors T1 and T2, gate drive circuits 371 and 372, and inductors 375 and 376. Gate drive circuit 371 receives the gate drive signal G1 and drives a gate of transistor T1. Gate drive circuit 372 receives the gate drive signal G2 and drives a gate of transistor T2. The gate drive signals G1 and G2 cause the first OLRMC 352 to generate a first reactance matching current IRM1 on the first reactance matching current conductor 360. The second OLRMC 353 comprises transistors T3 and T4, gate drive circuits 373 and 374, and inductors 377 and 378. Gate drive circuit 373 receives the gate drive signal G3 and drives a gate of transistor T3. Gate drive circuit 374 receives the gate drive signal G4 and drives a gate of transistor T4. The gate drive signals G3 and G4 cause the second OLRMC 353 to generate a second reactance matching current IRM2 on the second reactance matching current conductor 361. The second reactance matching current conductor 361 is directly coupled to the first reactance matching current conductor 360.

Figure 36:
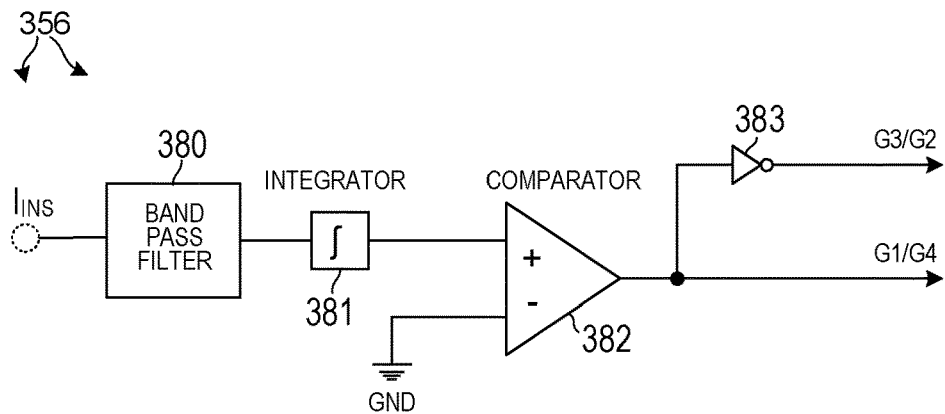
FIG. 36 is a detailed block diagram of the gate signal generator circuit 356.

FIG. 36 is a detailed block diagram of the gate signal generator circuit 356. The gate signal generator circuit 356 generates the gate drive signals G1, G2, G3, and G4 by using the input current information 359. In this example, the input current information 359 is an input current sense signal IINS. The gate signal generator circuit 356 comprises a band pass filter 380, an integrator 381, a comparator 382, and a NOT gate 383. During either inductive or capacitive load operation, the output of the NOT gate 383 supplies gating signals G2 and G3 onto transistors T2 and T3, respectively, and the output of comparator 382 supplies gating signals G1 and G4 onto transistors T1 and T4, respectively. The OLRMCCSG 351, the first OLRMC circuit 352, and the second OLRMC circuit 353 provide drive operation of either capacitive or inductive loads without reconfiguration. Due to this dual-mode functionality, the gate signal generator circuit 356 of FIG. 36 does not have a crossbar switch or input select bit as in FIGS. 20 and 24. This dual functionality reduces complexity and manufacturing costs.

Figure 37:
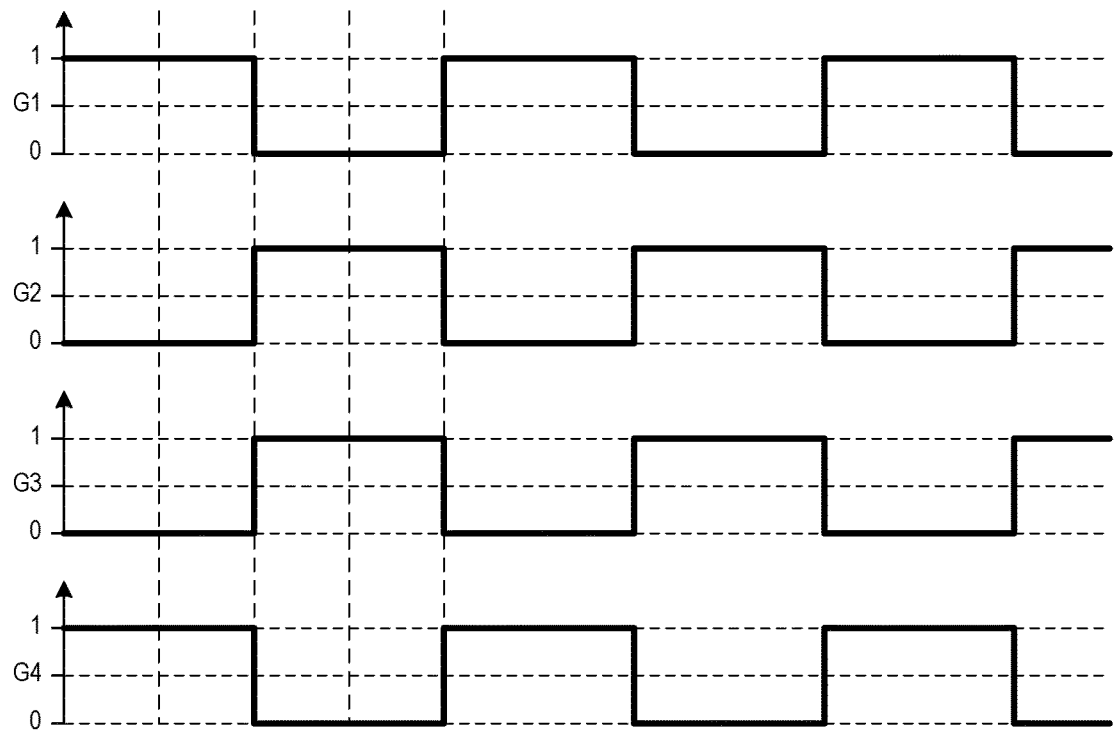
FIG. 37 is a waveform diagram of the gate drive signals G1, G2, G3, and G4 during steady state operation of circuit 350.

FIG. 37 is a waveform diagram of the gate drive signals G1, G2, G3, and G4 during steady state operation of circuit 350. The circuit 350 drives either capacitive or inductive loads without any re-configuration or alteration of how the gate drive signals G1, G2, G3, and G4 are generated. The first OLRMC 352 is controlled assuming load 355 is a capacitive load and the second OLRMC 353 is controlled assuming load 355 is an inductive load. It is understood that control operation is optionally switchable such that the first OLRMC 352 is controlled assuming load 355 is an inductive load and the second OLRMC 353 is controlled assuming load 355 is a capacitive load. In this example, the gate drive signals G1 and G2 supplied to the first OLRMC 352 are phase shifted ninety-degrees)(90°) behind the input current IIN. The gate drive signals G3 and G4 supplied to the second OLRMC 352 are phase shifted ninety-degrees)(90°) ahead of the input current IIN. The OLRMC gate drive signals G1, G2, G3, and G4 are generated without any sensing on the load and without involving any feedback loop.

Figure 38:
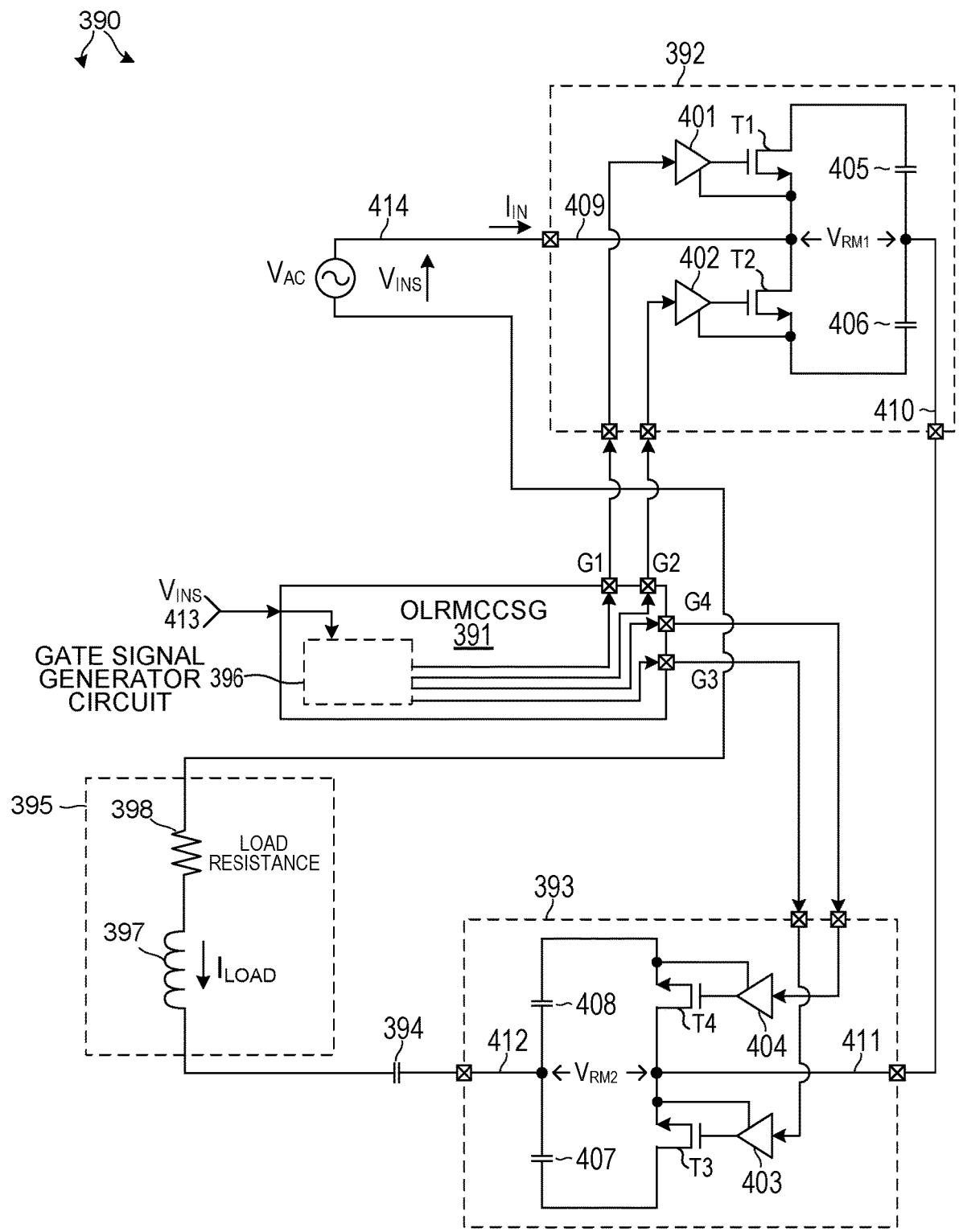
FIG. 38 is a detailed circuit diagram of a circuit 390 having two OLRMC circuits in a series configuration.

FIG. 38 is a detailed circuit diagram of a circuit 390 having two OLRMC circuits in a series configuration. The circuit 390 is realized using half-bridge circuit topologies. In this embodiment, the first OLRMC circuit 392 is coupled directly to a power source without an intervening amplifier as in other embodiments. The circuit 390 comprises an AC voltage source VAC, a OLRMCCSG 391, a first OLRMC circuit 392, a second OLRMC circuit 393, a capacitor 394, a load 395. The first OLRMC 392 and second OLRMC 393 are coupled in series with respect to the load 395. The load 395 includes an inductor 397 and a load resistance 398. The OLRMCCSG 391 generates gate drive signals G1, G2, G3, and G4. The OLRMCCSG 391 supplies gate drive signals G1 and G2 onto the first OLRMC 392. The OLRMCCSG 391 supplies gate drive signals G3 and G4 onto the second OLRMC 393.

The first OLRMC 392 comprises transistors T1 and T2, gate drive circuits 401 and 402, and capacitors 405 and 406. Gate drive circuit 401 receives the gate drive signal G1 and drives a gate of transistor T1. Gate drive circuit 402 receives the gate drive signal G2 and drives a gate of transistor T2. The gate drive signals G1 and G2 cause the first OLRMC 392 to generate a first reactance matching voltage VRM1 between input conductor 409 and output conductor 410. The second OLRMC 393 comprises transistors T3 and T4, gate drive circuits 403 and 404, and capacitors 407 and 408. Gate drive circuit 403 receives the gate drive signal G3 and drives a gate of transistor T3. Gate drive circuit 404 receives the gate drive signal G4 and drives a gate of transistor T4. The gate drive signals G3 and G4 cause the second OLRMC 393 to generate a second reactance matching voltage VRM2 between input conductor 411 and output conductor 412. The output conductor 412 of the second OLRMC 393 is directly coupled to the output conductor 410 of the first OLRMC 392.

The gate signal generator circuit 396 of the OLRMCCSG 391 uses input voltage information 413 to generate the gate drive signals G1, G2, G3, and G4. In this example, the input voltage information 413 is a voltage sense signal VINS. The voltage sense signal VINS 413 is obtained by directly or indirectly sensing a voltage on conductor 414, or is received through an external signal supplied to the OLRMCCSG 391.

Figure 39:
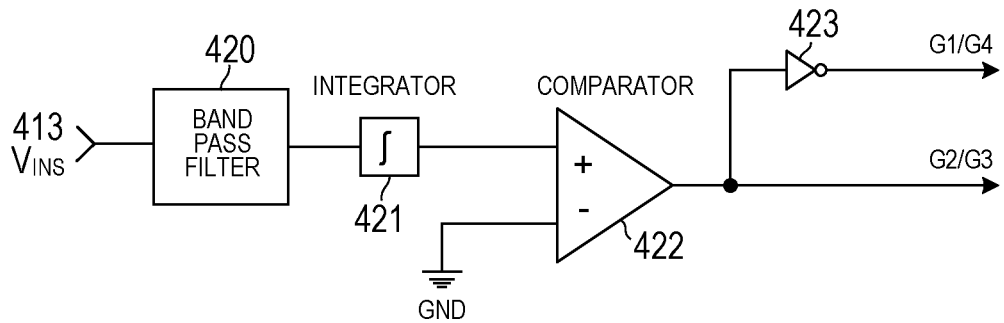
FIG. 39 is a detailed block diagram of the gate signal generator circuit 396.

FIG. 39 is a detailed block diagram of the gate signal generator circuit 396. The gate signal generator circuit 396 generates the gate drive signals G1, G2, G3, and G4 by using the input voltage information 413. In this example, the input voltage information 413 is the voltage sense signal VINS. The gate signal generator circuit 396 comprises a band pass filter 420, an integrator 421, a comparator 422, and a NOT gate 423. During either inductive or capacitive load operation, the output of the NOT gate 423 supplies gating signals G2 and G3 onto transistors T2 and T3, respectively, and the output of comparator 382 supplies gating signals G1 and G4 onto transistors T1 and T4, respectively. The OLRMCCSG 391, the first OLRMC circuit 392, and the second OLRMC circuit 393 provide drive operation of either capacitive or inductive loads without reconfiguration. Due to this dual-mode functionality, the gate signal generator circuit 396 of FIG. 36 does not have a crossbar switch or input select bit as in FIGS. 20 and 24. This dual functionality reduces complexity and manufacturing costs.

Figure 40:
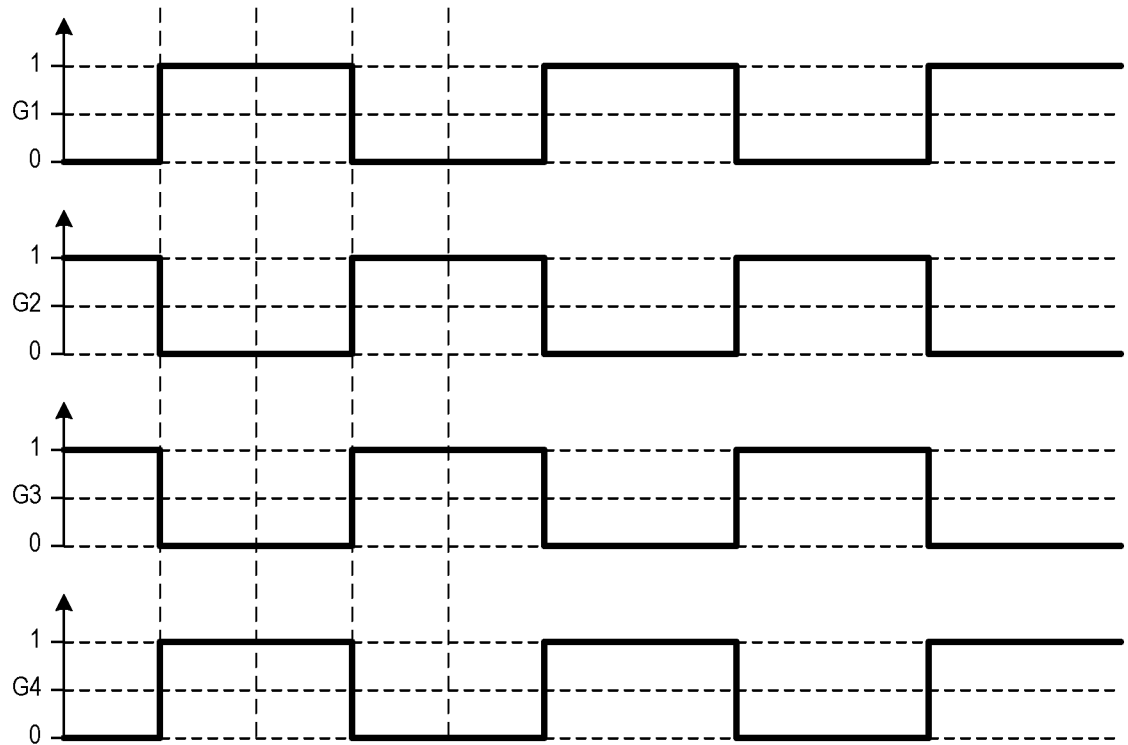
FIG. 40 is a waveform diagram of the gate drive signals G1, G2, G3, and G4 during steady state operation of circuit 390.

FIG. 40 is a waveform diagram of the gate drive signals G1, G2, G3, and G4 during steady state operation of circuit 390. The circuit 390 drives either capacitive or inductive loads without any re-configuration or alteration of how the gate drive signals G1, G2, G3, and G4 are generated. The first OLRMC 392 is controlled assuming load 395 is a capacitive load and the second OLRMC 393 is controlled assuming load 395 is an inductive load. It is understood that control operation is optionally switchable such that the first OLRMC 392 is controlled assuming load 395 is an inductive load and the second OLRMC 393 is controlled assuming load 395 is a capacitive load. In this example, the gate drive signals G1 and G2 supplied to the first OLRMC 392 are phase shifted ninety-degrees)(90°) behind the input voltage VIN. The gate drive signals G3 and G4 supplied to the second OLRMC 392 are phase shifted ninety-degrees)(90°) ahead of the input voltage VIN. The OLRMC gate drive signals G1, G2, G3, and G4 are generated without any sensing on the load and without involving any feedback loop.

Figure 41:
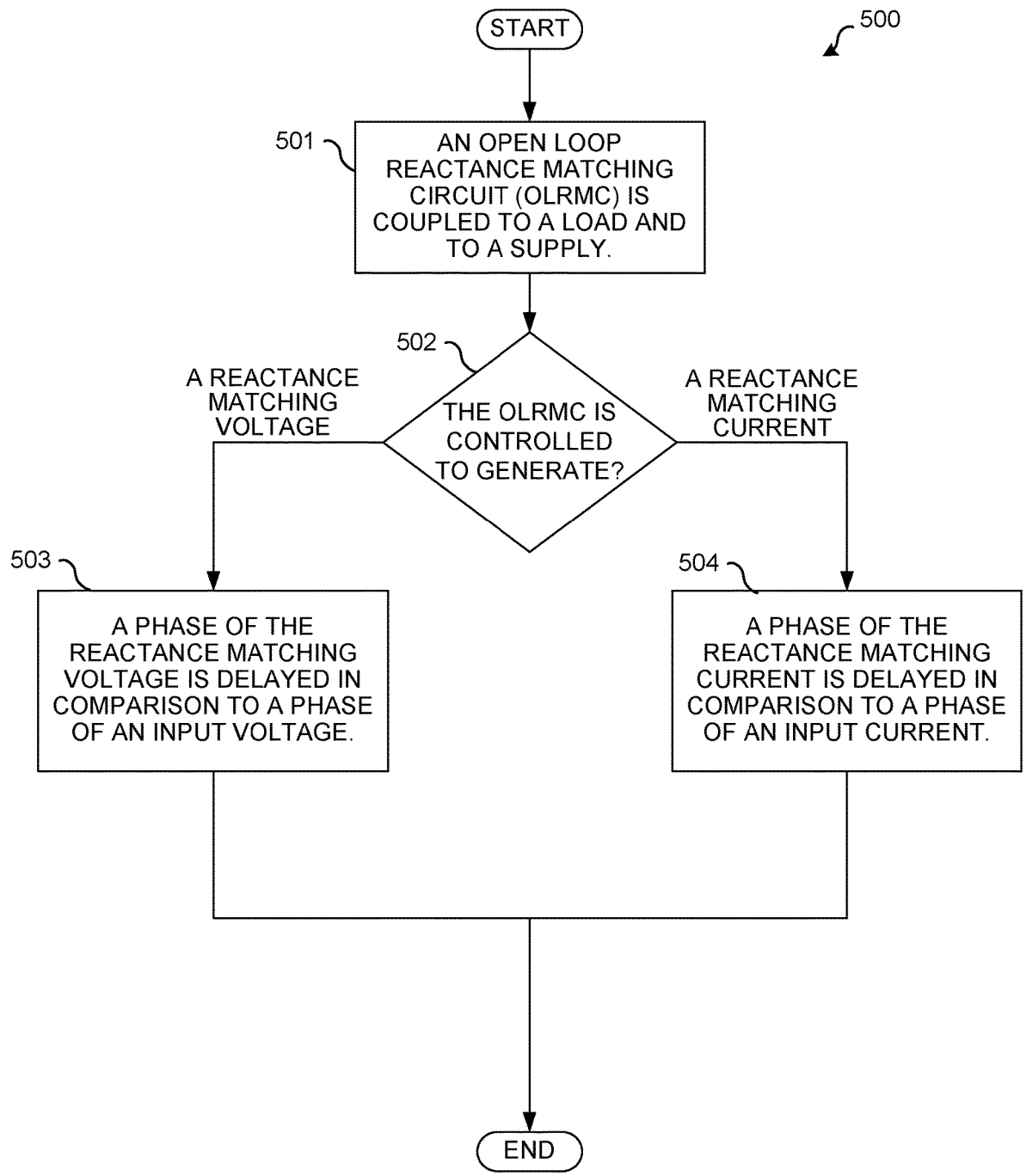
FIG. 41 is a flowchart of a method 500 in accordance with one novel aspect.

FIG. 41 is a flowchart of a method 500 in accordance with one novel aspect. In a first step (step 501), an Open Loop Reactance Matching Circuit (OLRMC) is coupled to a load. The OLRMC is also coupled to a supply. In a second step (step 502), the OLRMC is controlled to generate either a reactance matching voltage or a reactance matching current. In a third step (step 503), when a reactance matching voltage is generated by the OLRMC, a phase of the reactance matching voltage is delayed in comparison to a phase of an input voltage. In a fourth step (step 504), when a reactance matching current is generated by the OLRMC, a phase of the reactance matching current is delayed in comparison to a phase of an input current. For additional information on how to build and operate structures that perform the method 500, see: U.S. Provisional Patent Application Ser. No. 62/909,854 filed on Oct. 3, 2019, the entire subject matter of which is incorporated herein by reference.

Although certain specific embodiments are described above for instructional purposes, the teachings of this patent document have general applicability and are not limited to the specific embodiments described above. Some of the disclosed embodiments show the OLRMCCSG and the OLRMC in a packaged device, such as in FIGS. 1-10, however, in other embodiments the OLRMCCSG and the OLRMC are implemented in a circuit outside of a packaged setting. The OLRMCCSG and the OLRMC are implemented in both the packaged or non-packaged setting in combination with other OLRMCCSGs and OLRMCs in series, parallel, and both series and parallel combinations. Accordingly, various modifications, adaptations, and combinations of various features of the described embodiments can be practiced without departing from the scope of the invention as set forth in the claims.

What is claimed is:

1. A circuit comprising:
   an Open Loop Reactance Matching Circuit Control Signal Generator (OLRMCCSG); and
   an Open Loop Reactance Matching Circuit (OLRMC), wherein the OLRMC is coupled to the OLRMCCSG, wherein the OLRMC generates a reactance matching voltage or a reactance matching current, wherein the reactance matching voltage is phase delayed with respect to an input voltage, wherein the reactance matching current is phase delayed with respect to an input current, and wherein the OLRMC includes a half-bridge or full-bridge converter circuit that is coupled to a capacitive DC-link or coupled to an inductive DC-link.

2. The circuit of claim 1, wherein if input voltage or current information is available to the OLRMCCSG, then the OLRMCCSG uses the input voltage or current information in controlling the OLRMC to generate the reactance matching voltage or the reactance matching current, and wherein if the input voltage or current information is not available to the OLRMCCSG, then the OLRMCCSG senses input voltage or current information and uses the sensed input voltage or current information in controlling the OLRMC to generate the reactance matching voltage or the reactance matching current.

3. The circuit of claim 1, wherein the OLRMCCSG controls the OLRMC to generate the reactance matching voltage or the reactance matching current, and wherein the reactance matching voltage or the reactance matching current causes the input voltage and the input current to be in phase.

4. The circuit of claim 1, wherein if the OLRMC generates the reactance matching voltage, then the reactance matching voltage is ninety degrees out of phase with respect to the input voltage, and wherein if the OLRMC generates the reactance matching current, then the reactance matching current is ninety degrees out of phase with respect to the input current.

5. The circuit of claim 1, wherein the load is an inductive type load, wherein if the OLRMC generates the reactance matching voltage, then a phase of the reactance matching voltage leads ahead of a phase of the input voltage by ninety degrees, and wherein if the OLRMC generates the reactance matching current, then a phase of the reactance matching current lags behind a phase of the input current by ninety degrees.

6. The circuit of claim 1, wherein the load is an capacitive type load, wherein if the OLRMC generates the reactance matching voltage, then a phase of the reactance matching voltage lags behind a phase of the input voltage by ninety degrees, and wherein if the OLRMC generates the reactance matching current, then a phase of the reactance matching current leads ahead of a phase of the input current by ninety degrees.

7. The circuit of claim 1, wherein when the OLRMC is coupled in series between a supply and a load, then the OLRMC generates the reactance matching voltage that is phase shifted with respect to the input voltage, and wherein when the OLRMC is coupled in parallel between the supply and the load, then the OLRMC generates the reactance matching current that is phase shifted with respect to the input current.

8. The circuit of claim 1, wherein the OLRMCCSG comprises at least one component selected from the group consisting of: a microcontroller, a field-programmable gate array (FPGA), an integrated circuit, a discrete oscillator, and an analog circuit that receives a gate signal and outputs a phase delayed version of the gate signal.

9. A circuit comprising:
   an Open Loop Reactance Matching Circuit Control Signal Generator (OLRMCCSG); and
   an Open Loop Reactance Matching Circuit (OLRMC), wherein the OLRMC is coupled to the OLRMCCSG, wherein the OLRMC generates a reactance matching voltage or a reactance matching current, wherein the reactance matching voltage is phase delayed with respect to an input voltage, wherein the reactance matching current is phase delayed with respect to an input current, wherein the OLRMC comprises a first transistor and a second transistor, wherein the OLRMCCSG generates a first control signal that controls a gate of the first transistor, wherein the OLRMCCSG generates a second control signal that controls a gate of the second transistor, wherein the first control signal is phase shifted ninety-degrees with respect to either the input voltage or the input current, and wherein the second control signal is phase shifted ninety-degrees with respect to either the input voltage or the input current.

10. The circuit of claim 9, wherein the OLRMCCSG generates the first control signal and the second control signal using only input voltage information or input current information, and wherein the OLRMCCSG generates the first control signal and the second control signal without any feedback from the load or feedback from other circuitry.

11. The circuit of claim 9, wherein each of the first transistor and the second transistor is selected from the group consisting of: a bipolar junction transistor (BJT), a Silicon Carbide (SiC) transistor, a Gallium Nitride (GaN), an insulated-gate bipolar transistor (IGBT), and a metal-oxide-semiconductor field-effect transistor (MOSFET).

12. The circuit of claim 1, wherein the OLRMCCSG and the OLRMC are part of a packaged reactance matching device, wherein the packaged reactance matching device has at least one package terminal, and wherein the packaged reactance matching device is coupled between the supply and load via the at least one package terminal.

13. The circuit of claim 1, wherein the OLRMC is coupled to an amplifier, and wherein the OLRMCCSG controls both the amplifier and the reactance matching circuit.

14. A circuit comprising:
an Open Loop Reactance Matching Circuit Control Signal Generator (OLRMCCSG); and
an Open Loop Reactance Matching Circuit (OLRMC), wherein the OLRMC is coupled to the OLRMCCSG, wherein the OLRMC generates a reactance matching voltage or a reactance matching current, wherein the reactance matching voltage is phase delayed with respect to an input voltage, wherein the reactance matching current is phase delayed with respect to an input current, wherein the OLRMCCSG receives amplifier control signals output by an amplifier controller and generates control signals that are ninety degree phase shifted with respect to the amplifier control signals, and wherein the generated control signals are supplied to the OLRMC and the generated control signals control switching of transistors in the OLRMC.

15. A method comprising:
coupling an Open Loop Reactance Matching Circuit (OLRMC) to a load and to a supply; and
controlling the OLRMC to generate either a reactance matching voltage or a reactance matching current, wherein if the reactance matching voltage is generated, then the reactance matching voltage has a phase that is delayed as compared to a phase of an input voltage, wherein if the reactance matching current is generated, then the reactance matching current has a phase that is delayed as compared to a phase of an input current, wherein the OLRMC comprises a first transistor and a second transistor, wherein the OLRMCCSG generates a first control signal that controls a gate of the first transistor, wherein the OLRMCCSG generates a second control signal that controls a gate of the second transistor, wherein the first control signal is phase shifted ninety-degrees with respect to either the input voltage or the input current, and wherein the second control signal is phase shifted ninety-degrees with respect to either the input voltage or the input current.

16. The method of claim 15, wherein the controlling of the OLRMC causes the input voltage and input current output by the supply to be in phase.

17. The method of claim 15, wherein the load is an inductive type load, wherein if the OLRMC is controlled to generate the reactance matching voltage, then a phase of the reactance matching voltage leads ahead of a phase of the input voltage by ninety degrees, and wherein if the OLRMC is controlled to generate the reactance matching current, then a phase of the reactance matching current lags behind a phase of the input current by ninety degrees.

18. The method of claim 15, wherein the load is a capacitive type load, wherein if the OLRMC is controlled to generate the reactance matching voltage, then a phase of the reactance matching voltage lags behind a phase of the input voltage by ninety degrees, and wherein if the OLRMC is controlled to generate the reactance matching current, then a phase of the reactance matching current leads ahead of a phase of the input current by ninety degrees.

19. The method of claim 15, further comprising:
receiving or sensing input voltage or current information, wherein the received or sensed input voltage or current information is used in controlling the OLRMC to generate the reactance matching voltage or the reactance matching current.

* * * * *